(12) United States Patent
Richardson et al.

(10) Patent No.: US 10,741,724 B2
(45) Date of Patent: Aug. 11, 2020

(54) LIGHT EMITTING DIODE DEVICES WITH ZINC OXIDE LAYER

(71) Applicant: Seoul Viosys Co., Ltd., Ansan-si (KR)

(72) Inventors: Jacob J. Richardson, Santa Barbara, CA (US); Evan C. O'Hara, Santa Barbara, CA (US); SeomGeun Lee, Ansan-si (KR); ChanSeop Shin, Ansan-si (KR); MyeongHak Yang, Ansan-si (KR); JinWoong Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/255,059

(22) Filed: Sep. 1, 2016

(65) Prior Publication Data
US 2017/0098741 A1 Apr. 6, 2017

Related U.S. Application Data

(60) Provisional application No. 62/277,331, filed on Jan. 11, 2016, provisional application No. 62/241,680, (Continued)

(51) Int. Cl.
*H01L 33/42* (2010.01)
*H01L 33/00* (2010.01)
(Continued)

(52) U.S. Cl.
CPC .......... *H01L 33/42* (2013.01); *H01L 33/0066* (2013.01); *H01L 33/06* (2013.01);
(Continued)

(58) Field of Classification Search
CPC ......... H01L 2933/0016; H01L 33/0066; H01L 33/06; H01L 33/145; H01L 33/16;
(Continued)

(56) References Cited

U.S. PATENT DOCUMENTS 5,770,126 A 6/1998 Singh et al.
6,057,662 A 5/2000 McAndrew et al.
(Continued)

FOREIGN PATENT DOCUMENTS

CN 102774875 A 11/2012
CN 102950016 A 3/2013
(Continued)

OTHER PUBLICATIONS

International Search Report and Written Opinion in PCT/US17/27335, dated Aug. 25, 2017.
(Continued)

*Primary Examiner* — Mark W Tornow
*Assistant Examiner* — Priya M Rampersaud
(74) *Attorney, Agent, or Firm* — Perkins Coie LLP

(57) ABSTRACT

LED devices having high-quality single crystal ZnO structures for spreading currents and extracting light out of the LEDs are disclosed. In one aspect, a LED device is provided to include a substrate; a first semiconductor layer exhibiting a first conductivity type and formed over the substrate; an active light-emitting structure formed over the first semiconductor layer, the active light-emitting structure operable to emit light under electrical excitation; a second semiconductor layer exhibiting a second conductivity type and formed over the active light-emitting structure; and a single crystal ZnO structure formed over the second semiconductor layer and including a bottom single crystal ZnO portion over the second semiconductor layer and a top single crystal ZnO portion extending from the bottom single crystal ZnO portion, wherein the bottom single crystal ZnO portion is a contiguous single crystal ZnO portion without having voids.

17 Claims, 37 Drawing Sheets

Related U.S. Application Data filed on Oct. 14, 2015, provisional application No. 62/236,760, filed on Oct. 2, 2015, provisional application No. 62/236,754, filed on Oct. 2, 2015.

(51) Int. Cl.

| | |
|---|---|
| *H01L 33/06* | (2010.01) |
| *H01L 33/14* | (2010.01) |
| *H01L 33/16* | (2010.01) |
| *H01L 33/32* | (2010.01) |
| *H01L 33/38* | (2010.01) |

(52) U.S. Cl.
CPC .......... *H01L 33/145* (2013.01); *H01L 33/16* (2013.01); *H01L 33/32* (2013.01); *H01L 33/38* (2013.01); *H01L 2933/0016* (2013.01)

(58) Field of Classification Search
CPC ......... H01L 33/32; H01L 33/38; H01L 33/42; H01L 2251/305; H01L 35/22; H01L 51/5275; H01L 31/022483; H01L 21/02554; H01L 33/007; H01L 33/26; H01L 33/44; H01L 2924/00; H01L 21/0262; H01L 33/62; H01L 25/0753; H01L 2924/01322; H01L 2924/15787; H01L 2924/15788; H01L 21/02565; H01L 21/02645; H01L 21/203; H01L 21/205; H01L 21/30604; H01L 25/13; H01L 25/167; H01L 29/04; H01L 29/0684; H01L 29/7827; H01L 29/78642; H01L 29/7869; H01L 29/78693; H01L 41/1873; H01L 51/428; H01L 51/441; H01L 51/442; H01L 51/445; H01L 51/56; C01G 9/02; C01G 1/02; C01G 3/02; C01G 49/06; C01P 2006/16; C30L 37/00; C30B 19/00; C30B 29/16; C30B 7/00; C30B 23/02; C30B 7/005; C30B 7/14; C30B 19/02; C30B 19/06; C30B 19/061; C30B 19/08; C30B 19/10; C30B 23/002; C30B 23/005; C30B 23/06; C30B 23/066; C30B 25/02; C30B 25/18; C30B 29/22; C30B 29/605; G02F 1/133603; Y10T 428/12792; C04B 2235/3284; C04C 35/453; C09C 1/043; C09K 11/54; C23C 14/086; C23C 14/3414; C23C 18/1216; C23C 18/1266; G02B 5/0247; H01G 9/204; B01J 23/06
See application file for complete search history.

(56) References Cited

U.S. PATENT DOCUMENTS

| | | | |
|---|---|---|---|
| 6,078,064 A | 6/2000 | Ming-Jiunn et al. | |
| 6,409,907 B1 | 6/2002 | Braun et al. | |
| 8,183,575 B2 | 5/2012 | Farmer et al. | |
| 8,536,618 B2 | 9/2013 | Richardson et al. | |
| 8,637,334 B2 | 1/2014 | Thompson et al. | |
| 8,668,774 B2 | 3/2014 | Richardson et al. | |
| 8,729,580 B2 | 5/2014 | Lester | |
| 8,796,693 B2 | 8/2014 | Richardson et al. | |
| 2001/0051499 A1 | 12/2001 | Shinozaki | |
| 2005/0196887 A1 | 9/2005 | Liu | |
| 2006/0124051 A1 | 6/2006 | Yoshioka | |
| 2008/0295886 A1 | 12/2008 | Hu et al. | |
| 2009/0098043 A1* | 4/2009 | Song .................. | B82Y 30/00 423/622 |
| 2011/0030611 A1* | 2/2011 | Santailler ........... | C30B 23/005 117/108 |
| 2011/0101414 A1* | 5/2011 | Thompson .......... | H01L 33/14 257/103 |
| 2011/0143048 A1 | 6/2011 | Oladeji | |
| 2012/0048721 A1 | 3/2012 | Koji et al. | |
| 2012/0064314 A1 | 3/2012 | Sekiwa et al. | |
| 2014/0061711 A1* | 3/2014 | Yokoyama .......... | H01L 33/38 257/99 |
| 2014/0083352 A1* | 3/2014 | Richardson .......... | C01G 9/02 117/64 |
| 2014/0175452 A1* | 6/2014 | Richardson .......... | H01L 33/42 257/76 |
| 2016/0024688 A1* | 1/2016 | Richardson .......... | C30B 29/16 423/622 |
| 2016/0130719 A1 | 5/2016 | Richardson et al. | |
| 2017/0025575 A1* | 1/2017 | Zheng ................. | H01L 33/145 |
| 2017/0069797 A1 | 3/2017 | Richardson et al. | |
| 2017/0098741 A1* | 4/2017 | Lee .................... | H01L 33/0066 |
| 2017/0297920 A1 | 10/2017 | Richardson et al. | |
| 2017/0297921 A1 | 10/2017 | Richardson et al. | |
| 2017/0297922 A1 | 10/2017 | Richardson et al. | |
| 2018/0323346 A1* | 11/2018 | Lee .................... | G02F 1/133603 |

FOREIGN PATENT DOCUMENTS

| | | |
|---|---|---|
| CN | 103922390 A | 7/2014 |
| CN | 103943366 A | 7/2014 |
| EP | 1901363 A1 | 3/2008 |
| JP | 2009-046358 A | 3/2009 |
| WO | 2011106347 A1 | 9/2011 |
| WO | 2014147290 A1 | 9/2014 |

OTHER PUBLICATIONS

Corial, "Coriai3001L:GaN & Sapphire Etching ICP System," http://www.corial.net/resources/13-3001L/Corial3001L.pdf, Feb. 24, 2015, 19 pages.
Pooley et al., "Constrained, aqueous growth of three-dimensional single crystalline zinc oxide structures," App. Phys. Lett., vol. 86, No. 15, 2005, pp. 151113-1-151113-3.
Wikipedia, "OLEO," http://en.wikipedia.org/wiki/OLED, Jan. 29, 2017.
wikipedia, "Thin-film solar cell," http://en.wikipedia.org/wiki/Thin_film_solar cell, Sep. 2, 2015.
Richardson et al., "A Facile Route to Patterned Epitaxial ZnO Nanostructures by Soft Lithography," Journal of Materials Chemistry, 2011, 21, pp. 14417-14417, www.rsc.org/materials.
Reading et al., "High efficiency white LEDs with single-crystal ZnO current spreading layers deposited by aqueous solution epitaxy," Jan. 2, 2012, vol. 20, No. 81 Optics Express, pp. A13-A19.
Richardson et al., "Semipolar Single-Crystal ZnO Films Deposited by Low-Temperature Aqueous Solution Phase Epitaxy on GaN Light-Emitting Diodes," Applied Physics Express 4, 2011, The Japan Society of Applied Physics, pp. xxxxxx-1-xxxxxx-2.
Kim et al., "Light-Extraction Enhancement of GaInN Light-Emitting Diodes by Graded-Refractive-Index Indium Tin Oxide Anti-Reflection Contact," Advanced Materials, DOI: 10.1002/adma.200701015, 2008, 20, pp. 801-804.
Steigler et al., "Correlative infrared-electron nanoscopy reveals the local structure-conductivity relationship in zinc oxide nanowires," Nature Communications, 3:1131, DOI: 10.1038/ncomms2118 | www.nature.com.
Thompson et al., "Light Emitting Diodes with ZnO Current Spreading Layers Deposited from a Low Temperature Aqueous Solution," Applied Physics Express 2 (2009), 2009, The Japan Society of Applied Physics, pp. 042101-1-042101-3.
Richardson et al., "Controlling Low Temperature Aqueous Synthesis of ZnO. 2. A Novel Continuous Circulation Reactor," Crystal Growth & Design, vol. 9, No. 6, 2009, pp. 2576-2581.
Richardson et al., "Controlling Low Temperature Aqueous Synthesis of ZnO. 1. Thermodynamic Analysis," Crystal Growth & Design, vol. 9, No. 6, pp. 2570-2575.
Richardson et al., "Thermally Induced Pore Formation in Epitaxial ZnO Films Growth from Low Temperature Aqueous Solution," Crystal Growth & Design, 2011, 11 (8), pp. A-F.

(56) References Cited

OTHER PUBLICATIONS

Richardson, et al., "Rapid synthesis of epitaxial ZnO films from aqueous solution using microwave heating," Journal of Materials Chemistry, www.rsc.org/materials, The Royal Society of Chemistry, 2010, 7 pages.

Kim et al., "Growth of Heteroepitaxial ZnO Thin Films on GaN-Buffered Al2O3 (0001) Substrates by Low-Temperature Hydrothermal Synthesis at 90° C.," Advanced Functional Materials, 2007, 17, pp. 463-471.

Kim et al., "Hydrothermal Growth of Periodic, Single-Crystal ZnO Microrods and Microtunnels," Advanced Materials, DOI: 10.1002/adma.200600257, 2009, pp. 2453-2457.

Product Brochure, Same Sun, More Power, Royal DSM, KhepriCoat, 2012, http://dsm.com/content/dam/dsm/cworld/en_US/documents/khepricoat-product-brochure.pdf, 8 pages.

Andeed et al., "Lateral Epitaxial Overgrowth of ZnO in Water at 90° C.," DOI: 10.1002/adfm.20050817, Advanced Functional Materials, 2006, 16, pp. 799-804.

Andeen et al., "Crystal chemistry of epitaxial ZnOon (1 1 1 ) MgAl2O4 produced by hydrothermal synthesis," Journal of Crystal Growth, 259, doi:10.1016/S0022-0248(03)01589-6, 2003, pp. 103-109.

Nijikovsky et al., "Microstructure of ZnO films synthesized on MgAl2O4 from low-temperature aqueous solution: growth and post-annealing," J Mater Sci (2013) 48:1614-1622. DOI 10.1007/s10853-012-6918-9.

Scharrer et al., "Fabrication of inverted opal ZnO photonic crystals by atomic layer deposition," App. Phys. Lett., vol. 86, No. 15, 2015, pp. 151113-1-151113-3.

\* cited by examiner

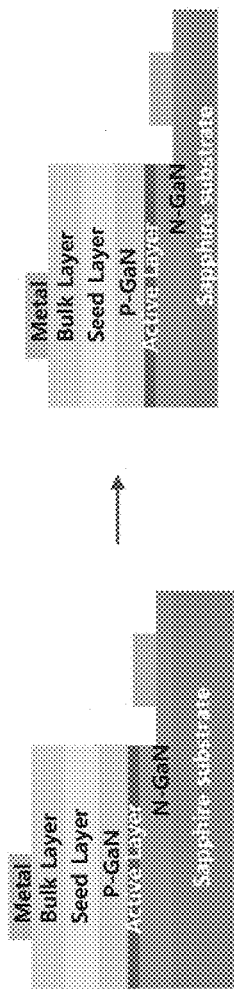
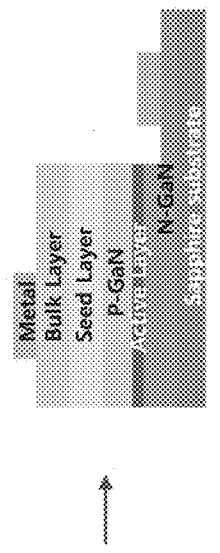
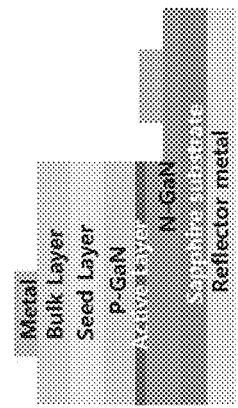
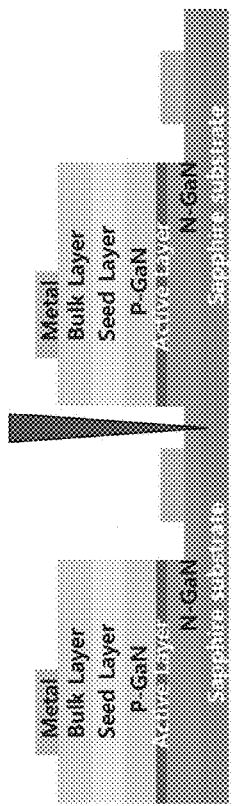
FIG. 3B

- Preparation of Seed Layer Solution
  - Material Combination : Na4OH + ZnO Powder
  - Stirring for 24hr
  - Centrifugal separator (10min)
  - Injection of solution with filter (<0.2um)
  - Spin coating (2000 RPM, 30sec)

FIG. 4A

- Preparation of Bulk Layer Solution
  - Material Combination
    → DI + Zn(NO3)2*6H2O + Na citrate + Ga(NO3)3*H2O + Na4OH
  - Fix specific PH
  - Flow solution in equipment chamber (continuous In → Out)
  - Fix solution temperature
  - Growth for 2hr (Wafer rotation)

FIG. 4B

Conventional PR Remover: ZnO Layer Damage

| Chemical Substances | Name | CAS No. or Identification No. | Weight % |
|---|---|---|---|
| N,N-DIMETHYLACETAMIDE | DMAC | 127-19-5 / KE-11114 | 45~50 |
| N-methylpyrrolidone | NMP | 872-50-4 / KE-25324 | 10~15 |
| 2-(2-Aminoethoxy)ethanol | AEE | 929-06-6 / KE-01341 | 12~18 |
| Sol-2 | - | Not available | 15~20 |
| Add-1 | - | Not available | ≤1 |
| Add-3 | - | Not available | ≤0.5 |
| Add-4 | - | Not available | ≤0.5 |

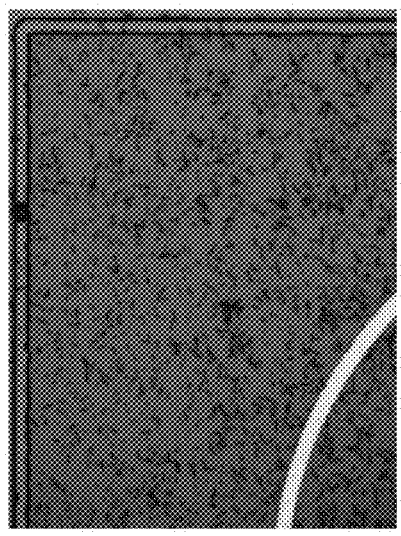

New PR Remover: ZnO Layer Damage

| Chemical Substances | CAS No | Weight % |
|---|---|---|
| Propylene Glycol Methyl Ether | 107-98-2 | < 50.0 |
| Alcohols, C12-14-Secondary, Ethoxylated | 9002-92-0 | < 2.5 |
| 1-Methyl-2-Pyrrolidinone | 872-50-4 | < 30.0 |
| Additives | - | Not available |
| DI Water | 7732-18-5 | Not available |

FIG. 5

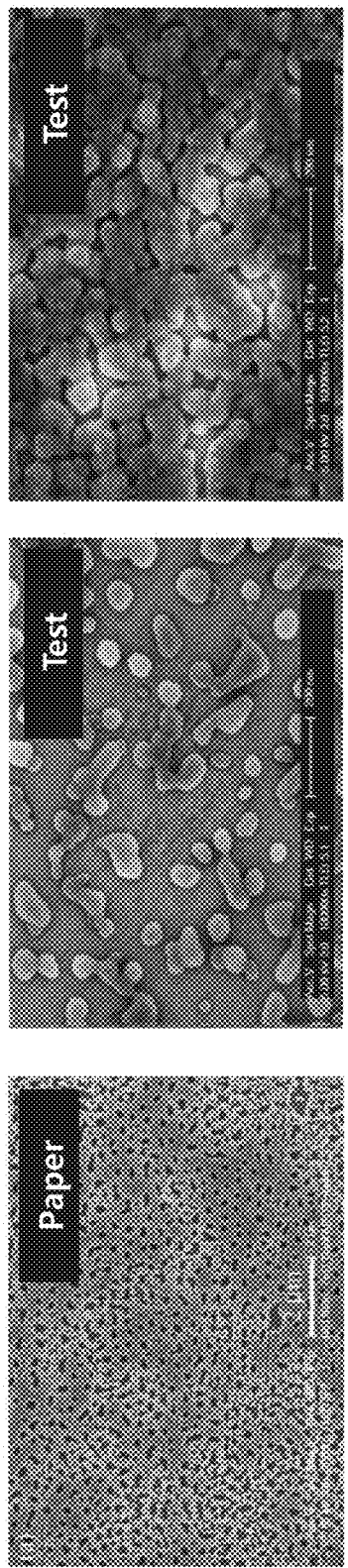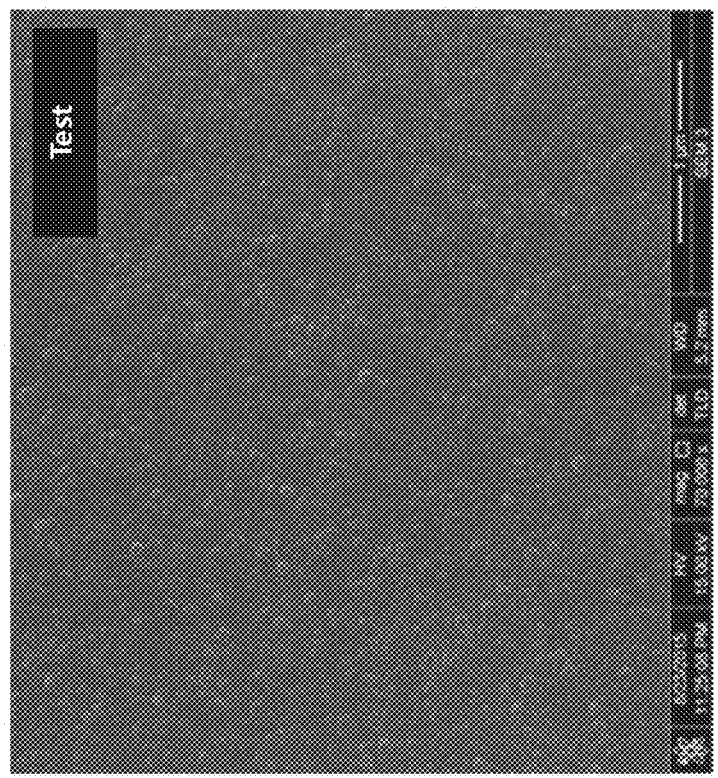
FIG. 6

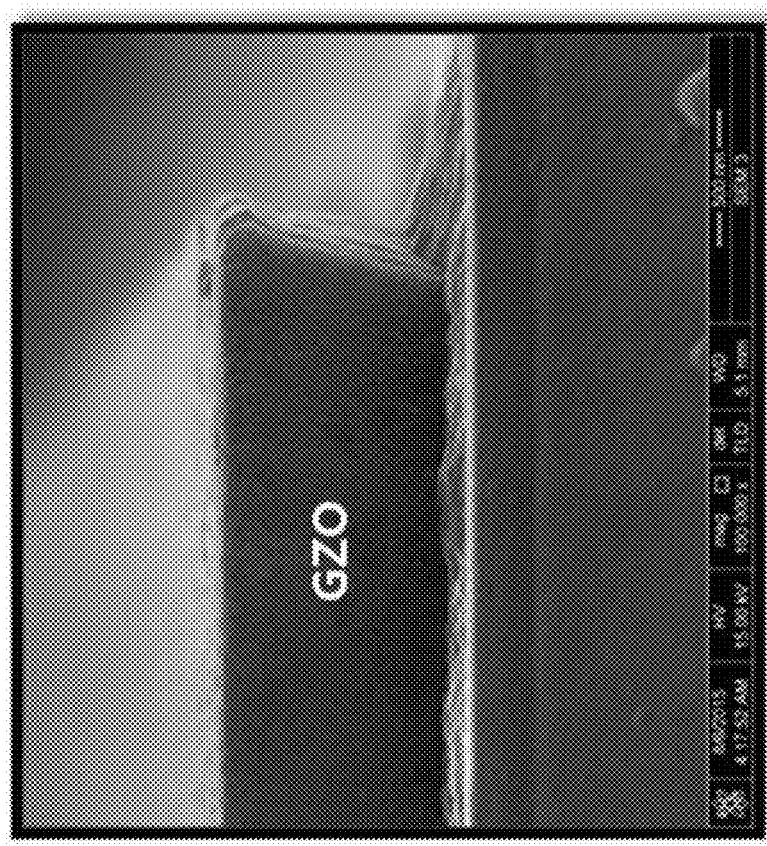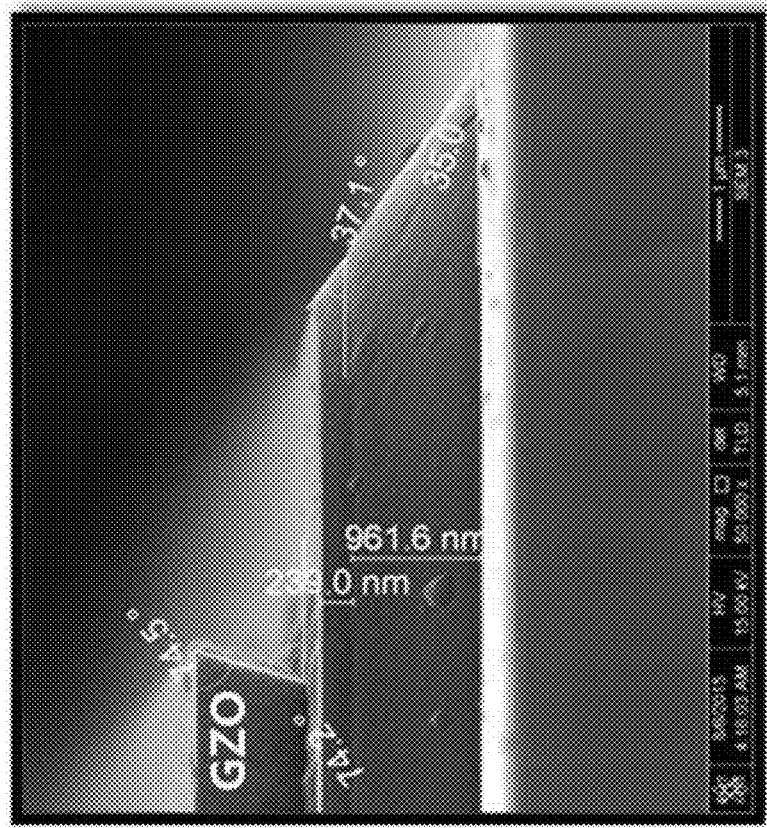
FIG.12

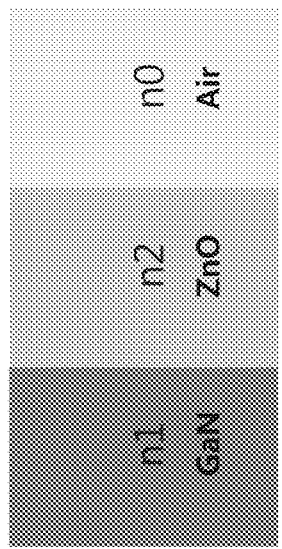

$$Reflectance: R = \left(\frac{n1-n2}{n1+n2}\right)^2$$

Reflectance of ZnO without air gaps $\quad n1 \to n2 = \left(\frac{2.4-2.0}{2.4+2.0}\right)^2 = 0.82\% \quad n2 \to n0 = \left(\frac{2.0-1.0}{2.0+1.0}\right)^2 = 11.11\%$ Input: 100 →0.82% Reflected 1st penetration:
99.18%    11.11% Reflected of the 1st penetration  → Output: 88.17%

$$Reflectance: R = \left(\frac{n1-n2}{n1+n2}\right)^2$$

Reflectance of ZnO with air gaps $\quad n1 \to n2 = \left(\frac{2.4-1.9}{2.4+1.9}\right)^2 = 1.35\% \quad n2 \to n0 = \left(\frac{1.9-1.0}{1.9+1.0}\right)^2 = 9.63\%$ Input: 100 →1.35% Reflected 1st penetration:
98.65%    9.63% Reflected of the 1st penetration → Output: 89.16%

FIG. 14

| Material | ITO | ZnO |
|---|---|---|
| Method/Thermal treatment | Sputter / 600°C anneal | Aqueous solution / 250°C anneal |
| Thickness (nm) | 60nm | 800nm |
| TEM Image (Cross-section) | | |
| Refractive Index (n) @450nm | 1.9831 | 1.9601 |
| Extinction coefficient (k) @450nm | 0.01291 | 0.00148 |
| Carrier concentration (#/cm$^3$) | 8.02E+20 | 9.52E+19 |
| Mobility (cm$^2$/sV) | 42.5 | 35.9 |
| Sheet resistance (Ω/□) | 28~32 | 21~24 |
| Resistivity (Ωcm) | 1.83E-04 | 1.83E-03 |
| Conductivity (Ωcm)$^{-1}$ | 5464.5 | 546.4 |
| Contact resistance (Ωcm$^2$) | 3.39E-03 | 3.13E-02 |

FIG. 17

6-2. Device performance : 950X500

| Device | Mo | 구분 | Wafer ID | IR | TOV | VF | WD | PO |
|---|---|---|---|---|---|---|---|---|
| M0905-GC | 51 | R | 5GV051A05 | 0.01 | 2.15 | 3.05 | 454.35 | 121.81 |
| | | A | 5GV051A06 | 0.02 | 2.22 | 3.06 | 454.75 | 120.6 |
| | | A | 5GV051A08 | 0.02 | 2.22 | 3.07 | 454.8 | 121.1 |
| | | R | 5GV051A13 | 0.01 | 2.13 | 3.02 | 453.63 | 122.19 |
| | | A | 5GV051A12 | 0.02 | 2.2 | 3.03 | 454.35 | 121.5 |
| | 13 | R | 5H1013D02 | 0.01 | 2.15 | 3.04 | 453.79 | 122.39 |
| | | A | 5H1013D04 | 0.02 | 2.22 | 3.14 | 454.35 | 120.14 |
| | | A | 5H1013D05 | 0.02 | 2.21 | 3.12 | 454.81 | 119.63 |
| | | R | 5H1013D12 | 0.01 | 2.12 | 3.05 | 454.37 | 121.79 |
| | 82 | A | 5H1013D11 | 0.02 | 2.22 | 3.11 | 454.23 | 120.5 |
| | | A | R15071608 2C07 | 0.02 | 2.24 | 3.75 | 451 | 122.25 |
| | | A | R15071608 2C10 | 0.02 | 2.24 | 3.7 | 451.16 | 121.8 |
| | | A | R15071608 2C11 | 0.03 | 2.24 | 3.73 | 451.83 | 122.45 |

| PKG type | Measurement Conditions | Reliability Test Result (after 1000Hr) |
|---|---|---|
| Au STEM | 25°C, 100mA, 1000hr | o ITO : VF 102.4% PO 99.97%<br>o ZnO : VF PO 99.4% PO 100.01% |
| | 25°C, 100mA, 1000hr | o ITO : VF 100.04% PO 99.93%<br>o ZnO : VF 99.46% PO 99.97% |
| | 40°C(30M)~120°C(30M)<br>1,000cycle (ON/OFF) | o No error observed after 1000 cycle |
| 5630PKG | 25°C, 65mA, 1000hr | o ITO : VF 101%, PO 101.1%<br>o ZnO : VF 99%, PO 101.3% |
| | 85°C, 85%, 65mA, 1000hr | o ITO : VF 101.7% PO 100.4%<br>o ZnO : VF 99.3% PO 100.2% |

FIG. 21

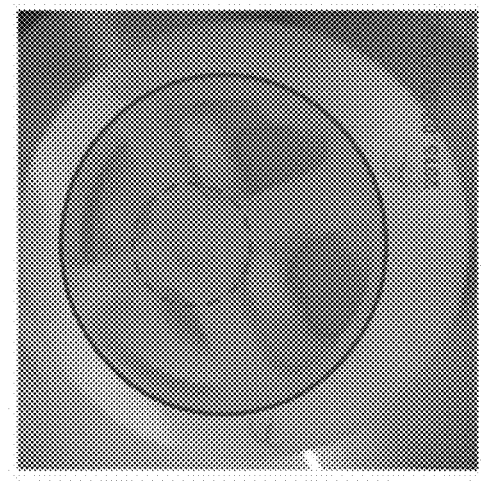
401: Ready to One of the bolt expected holder
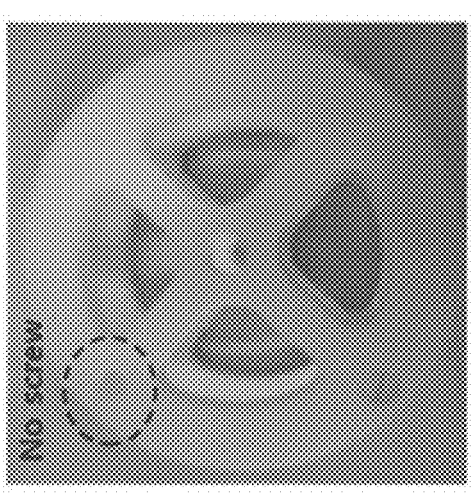
402: Loading wafers on holder along vertical direction
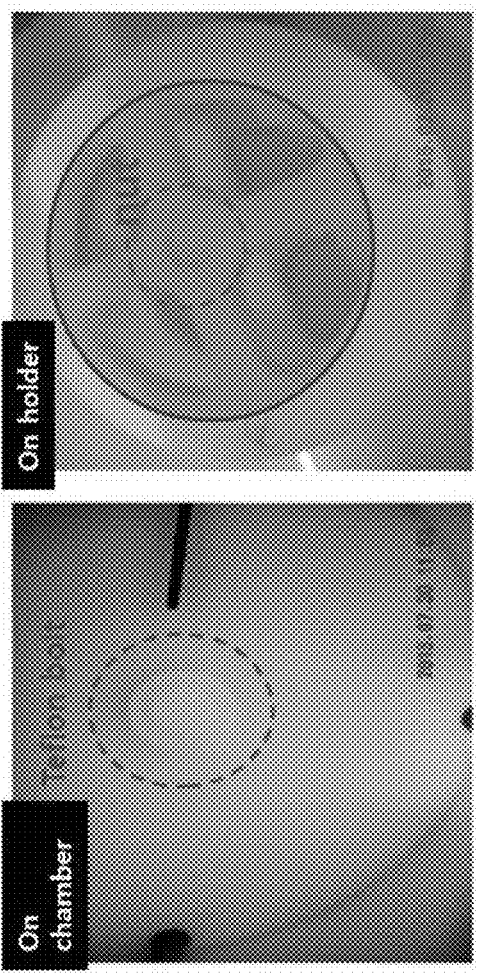
403: The bolt which is excepted on holder put in holder
404: Holder put into chamber fix a bolt portion with a nut potion of holder
FIG. 25

| Growth temp. | ITO | No CBL | CBL |
|---|---|---|---|
| PO [mW] | 127.30 | 127.29 | 126.65 |
| VF [V] | 3.05 | 3.09 | 3.10 |

LIGHT EMITTING DIODE DEVICES WITH ZINC OXIDE LAYER

PRIORITY CLAIM AND RELATED PATENT APPLICATIONS

This patent document claims priority and the benefits of U.S. Provisional Application No. 62/236,754 entitled "Light Emitting Diode Devices with Zinc Oxide Layer", filed on Oct. 2, 2015, U.S. Provisional Application No. 62/236,760 entitled "Systems and Methods for Thermal Hydro-Synthesis of Semiconductor Materials", filed on Oct. 2, 2015, U.S. Provisional Application No. 62/241,680 entitled "Methods for Manufacturing Light Emitting Diode Devices with Zinc Oxide Layer", filed on Oct. 14, 2015, U.S. Provisional Application No. 62/277,331 entitled "Light Emitting Diode Devices with Zinc Oxide Layer", filed on Jan. 11, 2016, the disclosures of which are incorporated by reference as part of the specification of this document.

TECHNICAL FIELD

This patent document relates to systems, devices, and processes that provide a zinc oxide (ZnO) based light emitting diode device.

BACKGROUND

Solid-state lasers and light-emitting-diode (LED) devices can be made based on the Group III-Nitride (III-N) family of semiconductors and such devices have significantly changed fields of lighting, displays, and data storage. Efficient light extraction is important for energy efficient, high brightness light emitting diodes (LEDs). In III-N based LED devices, the typically low electrical conductivity of the p-type layer can result in much higher current injection into the active layers, and thus light generation, near the point of electrical contact.

One way of achieving high LED device efficiency is to implement a current-spreading layer that is highly transparent to light, and that low-resistance electrical contacts can be formed with the p-GaN layers. Indium tin oxide (ITO) is currently the material of choice for LED current spreading layers by various LED makers, owing to its high conductivity, and low optical absorption. There is considerable variations in the reported properties of ITO films depending on various factors such as the deposition methods, the deposition surface properties, annealing conditions, the elemental ratios of indium and tin in the films. ITO is an n-type semiconductor with a wide band-gap of 4.0 eV. However, the large amount of defects in ITO films lends to high optical absorption in the visible range, which is generally reported to be in the 650-2000 cm-1 range.

Zinc oxide (ZnO) is an optically transparent, wide band gap semiconductor. A band gap of 3.3 eV, an exciton binding energy of 60 meV, large breakdown strength, and a large saturation velocity have led to interest in ZnO as a possible candidate for use in light emitting devices and other high-power density, high-temperature semiconducting devices. In order to be used in such devices, high quality epitaxial ZnO thin films will typically be required. Many of these applications will also require the ability to produce both n-type and p-type ZnO. Unfortunately, ZnO has a strong tendency for n-type behavior and stable, reliable, and reproducible p-type ZnO has proven extremely difficult to produce. However, the tendency for high n-type conductivity combined with the high optical transparency of ZnO make it very well suited for use as a transparent conductive oxide. Like most inorganic material films used in the semiconductor industry, any ZnO films used are currently produced using vapor phase methods such as molecular beam epitaxy (MBE), pulsed laser deposition (PLD), sputtering, and metal organic chemical vapor deposition (MOCVD). However, it is also possible to produce ZnO films, including epitaxial films, using low temperature aqueous solution methods.

Because the general simplicity of the required equipment, along with the low temperatures and atmospheric pressure used, low temperature aqueous solution methods present significant cost advantages over vapor phase deposition techniques. Aqueous solution methods have been used for some time to produce ZnO powders and polycrystalline films, but more recently, it has been shown that epitaxial ZnO films can also be produced using low temperature aqueous solution methods. In general, an epitaxial film will be more transparent and have higher conductivity than a polycrystalline film of the same composition, due to the lack of grain boundaries. However, the current state of the art transparent current spreading layer technology uses a polycrystalline ITO film. Because of the dissimilar crystal structures of III-N materials and ITO, epitaxial film deposition of ITO is generally not possible. Zinc oxide, on the other hand, has the same Wurtzite crystal structure as the III-N materials used in LED devices, making epitaxial growth is possible by numerous deposition methods, including low temperature aqueous solution methods.

SUMMARY

Techniques, systems, and devices are disclosed for implementing a ZnO based LED device.

In one example aspect, a light emitting diode (LED) device is provided to include: a substrate; a first semiconductor layer exhibiting a first conductivity type and formed over the substrate; an active light-emitting structure formed over the first semiconductor layer, the active light-emitting structure operable to emit light under electrical excitation; a second semiconductor layer exhibiting a second conductivity type and formed over the active light-emitting structure; a single crystal ZnO structure formed over the second semiconductor layer and including a bottom single crystal ZnO portion over the second semiconductor layer and a top single crystal ZnO portion extending from the bottom single crystal ZnO portion, wherein the bottom single crystal ZnO portion is a contiguous single crystal ZnO portion without having voids.

In some implementations, the top single crystal ZnO portion and the bottom single crystal ZnO portion form a contiguous single crystal ZnO. In some implementations, the top single crystal ZnO portion and the bottom single crystal ZnO portion are formed by two different thermal hydro synthesis processes, and the bottom single crystal ZnO portion is formed by a first thermal hydro synthesis process and the top single crystal ZnO portion is formed by a second thermal hydro synthesis process subsequent to the first thermal hydro synthesis process. In some implementations, the top single crystal ZnO portion includes voids to improve a performance of the LED device. In some implementations, the voids are relatively uniformly distributed in the top single crystal ZnO portion. In some implementations, the top single crystal ZnO portion and the voids therein are structured to provide air gaps that affect light extraction efficiency of the LED device. In some implementations, the top single crystal ZnO portion and the voids therein are structured to have a positional distribution that enhances an optical or electrical property of the LED device. In some implementations, the bottom single crystal ZnO portion has a thickness of a few hundred angstroms. In some implementations, the bottom single crystal ZnO portion has a thickness equal to or less than 200 angstroms. In some implementations, the top single crystal ZnO portion has a thickness less than 1 μm. In some implementations, the top single crystal ZnO portion has a thickness equal to or less than 8000 angstroms. In some implementations, the single crystal ZnO structure has an inverse masa structure. In some implementations, the first and second semiconductor layers include GaN.

In another example aspect, a light emitting diode (LED) device is disclosed and includes: a substrate; a first semiconductor layer exhibiting a first conductivity type and formed over the substrate; an active light-emitting structure formed over the first semiconductor layer, the active light-emitting structure operable to emit light under electrical excitation; a second semiconductor layer exhibiting a second conductivity type and formed over the active light-emitting structure; a single crystal ZnO structure formed over the second semiconductor layer and including a bottom single crystal ZnO portion over the second semiconductor layer and a top single crystal ZnO portion extending from the bottom single crystal ZnO portion, wherein the top single crystal ZnO portion is structured to include voids to improve a performance of the LED device.

In some implementations, the top single crystal ZnO portion is structured to include the voids to improve a light extraction performance of the LED device. In some implementations, the top single crystal ZnO portion is structured to include the voids to improve an electrical performance of the LED device. In some implementations, the top single crystal ZnO portion and the bottom single crystal ZnO portion form a contiguous single crystal ZnO. In some implementations, the top single crystal ZnO portion and the bottom single crystal ZnO portion are formed by two different thermal hydro synthesis processes, and the bottom single crystal ZnO portion is formed by a first thermal hydro synthesis process and the top single crystal ZnO portion is formed by a second thermal hydro synthesis process subsequent to the first thermal hydro synthesis process. In some implementations, the bottom single crystal ZnO portion is a contiguous single crystal ZnO portion without having voids that exposes portions of the second semiconductor layer underneath the bottom single crystal ZnO portion.

In another example aspect, a light emitting diode (LED) device is disclosed and includes: a substrate; a first conductivity typed semiconductor layer formed over the substrate; an active layer formed over the first typed semiconductor layer; a second conductivity typed semiconductor layer formed over the active layer; a ZnO seed layer formed over the second conductivity typed semiconductor layer, the ZnO seed layer and the ZnO bulk layer form a single crystal structure; and a ZnO bulk layer formed over the ZnO seed layer.

In some implementations, the ZnO seed layer has a relatively continuous surface. In some implementations, the ZnO seed layer and the ZnO bulk layer exhibit no boundary between the ZnO seed layer and the ZnO bulk layer. In some implementations, the ZnO seed layer has a thickness on the order of a few hundreds angstrom. In some implementations, the ZnO seed layer has a thickness equal to or less than 200 angstrom. In some implementations, the ZnO seed layer includes an un-doped layer. In some implementations, the ZnO bulk layer includes a doped layer having the first type conductivity. In some implementations, the first conductivity typed semiconductor layer and the second conductivity typed semiconductor layer include GaN. In some implementations, the first conductivity typed semiconductor layer has a n type conductivity and the second conductivity typed semiconductor layer has a p type conductivity. In some implementations, the second conductivity typed semiconductor layer forms an Ohmic contact with the ZnO bulk layer. In some implementations, the ZnO bulk layer has a thickness less than 1 μm. In some implementations, the ZnO bulk layer has a thickness equal to or less than 8000 angstrom. In some implementations, the ZnO bulk layer includes voids formed inside the ZnO bulk layer. In some implementations, the voids provide air gaps that affect refractive index of the ZnO bulk layer and operate to enhance optical properties of the LED device. In some implementations, the voids are controlled to have a positional distribution that allows to enhance optical properties of the LED device. In some implementations, the voids are controlled to have a sufficient amount to enhance optical properties of the LED device. In some implementations, the second conductivity typed semiconductor layer and the ZnO bulk layer forms an Ohmic contact. In some implementations, the ZnO bulk layer has an inverse masa structure. In some implementations, the ZnO bulk layer has a thickness greater than 50 times that of the ZnO seed layer. In some implementations, the ZnO seed layer is free of citrate.

In another example aspect, a light emitting diode (LED) device is disclosed and includes a substrate; a first conductivity typed semiconductor layer formed over the substrate; an active layer formed over the first type conductivity; a second conductivity typed semiconductor layer formed over the active layer; a ZnO seed layer formed over the second conductivity typed semiconductor layer; and a ZnO bulk layer formed over the ZnO seed layer and including voids in the ZnO bulk layer.

In some implementations, the ZnO bulk layer is porous. In some implementations, the voids are relatively uniformly distributed. In some implementations, the voids provide air gaps that affect extraction efficiency and operate to enhance optical properties of the LED device. In some implementations, the voids are controlled to have a positional distribution that allows to enhance optical properties of the LED device. In some implementations, the voids are controlled to have a sufficient amount to enhance optical properties of the LED device. In some implementations, the LED device exhibits improved light extraction efficiency compared to the ZnO bulk layer without voids. In some implementations, the ZnO bulk layer includes a doped layer having the first type conductivity. In some implementations, the first conductivity typed semiconductor layer has a n type conductivity and the second conductivity typed semiconductor layer has a p type conductivity. In some implementations, the ZnO seed layer has a relatively continuous surface. In some implementations, the ZnO seed layer and the ZnO bulk layer form a single crystal structure. In some implementations, the ZnO seed layer and the ZnO bulk layer exhibit no boundary between the ZnO seed layer and the ZnO bulk layer. In some implementations, the ZnO seed layer has a thickness on the order of a few hundreds angstrom. In some implementations, the ZnO seed layer has a thickness equal to or less than 200 angstrom. In some implementations, the ZnO bulk layer has a thickness less than 1 μm. In some implementations, the ZnO bulk layer has a thickness equal to or less than 8000 angstrom. In some implementations, the ZnO bulk layer has an inverse masa structure In another example aspect, a method of fabricating a light emitting diode (LED) device including a ZnO structure is disclosed. The method includes: providing a substrate; forming light-emitting semiconductor layers over the substrate, the light-emitting semiconductor layers operable to emit light under electrical excitation; and growing a single crystal ZnO structure over the light-emitting semiconductor layers, wherein the growing of the single crystal ZnO structure includes: forming a bottom single crystal ZnO portion over a top of the light-emitting semiconductor layers using a first aqueous solution, wherein the top of the light-emitting semiconductor layers is hydrophilicity treated; and forming a top single crystal ZnO portion using a second aqueous solution to extend from the bottom single crystal ZnO portion.

In some implementations, the forming of the bottom single crystal ZnO portion includes performing a spin coating while maintaining a relatively regular growing speed of the bottom single crystal ZnO portion. In some implementations, the method further comprises controlling the forming of the bottom single crystal ZnO portion to ensure that the bottom single crystal ZnO portion is a contiguous structure over the top of the light-emitting semiconductor layers without having voids that expose the top of the light-emitting semiconductor layers. In some implementations, the forming of the top single crystal ZnO portion includes rotating the substrate along a vertical direction within a chamber, the substrate is previously processed to include the light-emitting semiconductor layers. In some implementations, the forming of the top single crystal ZnO portion includes controlling a growing speed of the top single crystal ZnO portion to provide a desired thickness of the top single crystal ZnO portion. In some implementations, the method further comprises: controlling the forming of the top single crystal ZnO portion to introduce voids into the top single crystal ZnO portion. In some implementations, the controlling of the forming of the top single crystal ZnO portion includes varying an amount or a positional distribution of the voids to enhance a performance of the LED device. In some implementations, the forming of the bottom single crystal ZnO portion includes controlling PH level to supersaturate the first aqueous solution. In some implementations, the forming of the bottom single crystal ZnO portion includes forming the bottom single crystal ZnO portion to occupy at least 90% of a total surface of a top of the light-emitting semiconductor layers. In some implementations, the method further comprises, after forming of the top single crystal ZnO portion: forming a photoresist (PR) layer over the top single crystal ZnO portion; and removing the PR layer using a PR remover free of an alkarine element. In some implementations, the PR remover includes propylene glycol monomethyl ether, alcohols, C12-14, ethoxylated, or 1-metil-2-pirrolidona. In some implementations, the PR remover includes at least one of propylene glycol monomethyl ether or N-metil-2-pirrolidona. In some implementations, the method further comprises: performing an annealing process on the bottom single crystal ZnO portion at a first temperature; and performing an annealing process on the top single crystal ZnO portion at a second temperature, wherein the second temperature is lower than the first temperature. In some implementations, the method further comprises: etching the single crystal ZnO structure, the etched single crystal ZnO structure having a sidewall with an inverse mesa shape. In some implementations, the substrate has a diameter equal to or greater than 4 inch. In some implementations, the growing of the single crystal ZnO structure includes controlling a growing speed of the single crystal ZnO structure to have a desired thickness.

In another example aspect, thermal hydro-synthesis (THS) devices, systems, and methods are disclosed for forming layers of semiconductor materials to produce optoelectronic devices. In some aspects, a device for producing a ZnO layer on GaN layer (e.g., p-type GaN layer) is disclosed.

In some aspects, a device for fabricating a semiconductor material device includes a housing structured to include an interior chamber to contain a fluid, the housing including a first access opening to the interior chamber to allow a liquid solution to enter, a second access opening to the interior chamber to allow the liquid solution to exit, and a third access opening to the interior chamber to allow a gas to exit or enter; a heating unit to apply heat into the interior chamber; a holder disposed within the interior chamber and structured to include a receiving surface to receive a sample or substrate upon which to fabricate semiconductor device layers, where the holder is oriented in the interior chamber such that the receiving surface is along a vertical direction; and a motor coupled to the holder and operable to drive rotational movement of the holder within the interior chamber to cause the holder to spin about its central axis, in which the device is operable to facilitate deposition and growth of a semiconductor layer on the substrate during spinning of the holder immersed in the solution under applied heat within the interior chamber to produce a semiconductor material device.

In some aspect, a method for fabricating a light emitting diode (LED) device including a ZnO structure includes holding a substrate wafer within a chamber so that a surface of the substrate wafer is along a vertical direction along a gravitational field, in which the substrate wafer is previously processed to include light-emitting semiconductor layers operable to emit light under electrical excitation; spinning the substrate wafer to spin about a horizontal axis; and while maintaining the substrate wafer to spin about the horizontal axis, performing a thermal hydro synthesis process to grow a single crystal ZnO structure over the light-emitting semiconductor layers to achieve a high quality in the grown single crystal ZnO structure.

In another example aspect, a light emitting diode (LED) device is provided to comprise: a substrate; a semiconductor layer formed over the substrate; a ZnO layer formed over the semiconductor layer and including a single-crystal ZnO portion and a poly-crystal ZnO portion; an electrode pad formed over the ZnO layer to be in direct contact with the single-crystal ZnO portion; and a current blocking layer (CBL) formed between the poly-crystal ZnO portion and the semiconductor layer.

In some implementations, the single-crystal ZnO portion is positioned directly above the semiconductor layer. In some implementations, the single-crystal ZnO portion and the poly-crystal ZnO portion form a boundary preventing current from spreading between the boundary. In some implementations, the ZnO layer includes a ZnO seed layer and a ZnO bulk layer formed on the ZnO seed layer. In some implementations, the semiconductor layer includes a material having a lattice coefficient similar to that of the ZnO layer. In some implementations, the CBL includes an insulation material including $SiO_2$. In some implementations, the CBL includes a material having a lattice coefficient different from that of the ZnO layer.

In another example aspect, a light emitting diode (LED) device is disclosed and includes a substrate; a semiconductor layer formed over the substrate; a ZnO layer formed over the semiconductor layer; an electrode pad formed over the ZnO layer; a current blocking layer (CBL) formed between portions of the ZnO layer and the semiconductor layer, the portions of the ZnO layer spaced apart from one another and the CBL having a pattern, wherein the electrode pad directly contacts other portions of the ZnO layer that are positioned directly above the semiconductor layer.

In some implementations, the portions of the ZnO layer formed over the CBL have a poly-crystal structure and other portions of the ZnO layer formed directly over the semiconductor layer have a single-crystal structure. In some implementations, the single-crystal ZnO portion and the poly-crystal ZnO portion form a boundary preventing current from spreading between the boundary. In some implementations, the semiconductor layer includes a material having a lattice coefficient similar to that of the ZnO layer. In some implementations, the CBL includes an insulation material including SiO2. In some implementations, the CBL includes a material having a lattice coefficient different from that of the ZnO layer.

In another example aspect, a light emitting diode (LED) device is disclosed and includes a substrate; a semiconductor layer formed over the substrate; a current blocking layer (CBL) formed over the semiconductor layer; a ZnO layer formed over the CBL to cover the CBL including a top surface and sides of the CBL, the ZnO layer extended to cover the semiconductor layer; an electrode pad formed over the ZnO layer and having a size sufficiently covering the CBL such that the electrode pad directly contacts with the ZnO layer covering the semiconductor layer.

In some implementations, the ZnO layer covering the semiconductor layer has a single-crystal structure. In some implementations, the ZnO layer covering the top surface of the CBL has a poly-crystal structure. In some implementations, the ZnO layer covering the sides of the CBL includes a boundary between different crystal structures. In some implementations, the semiconductor layer includes a material having a lattice coefficient similar to that of the ZnO layer. In some implementations, the CBL includes an insulation material including SiO2. In some implementations, the CBL includes a material having a lattice coefficient different from that of the ZnO.

BRIEF DESCRIPTION OF THE DRAWINGS

FIGS. 3A-3B illustrate an exemplary manufacturing process for a ZnO based LED device.

FIGS. 4A and 4B illustrate exemplary preparations for a ZnO seed layer and a ZnO bulk layer.

FIG. 5 shows tables comparing the conventional PR remover and the newly developed PR remover.

FIG. 6 shows examples of a hydrophilicity treated seed layer along with conventional seed layers for which hydrophilicity treatment has not been performed.

FIG. 12 shows an exemplary image of a sidewall of a ZnO layer having an inverse mesa structure.

FIG. 14 explains how voids of a ZnO layer help a ZnO based LED device to have the improved extraction efficiency based on density of the voids of the ZnO bulk layer.

FIGS. 15 through 18 show electrical and optical output properties of a ZnO based LED device as compared to otherwise identical III-Nitride light emitting diode devices using ITO.

FIGS. 19 through 21 show the device performance and reliability of the ZnO based LED device examples.

FIG. 25 shows images of an example embodiment of the holder to secure and rotate the substrate during a layer fabrication process of the present technology.

DETAILED DESCRIPTION

Figure 1:
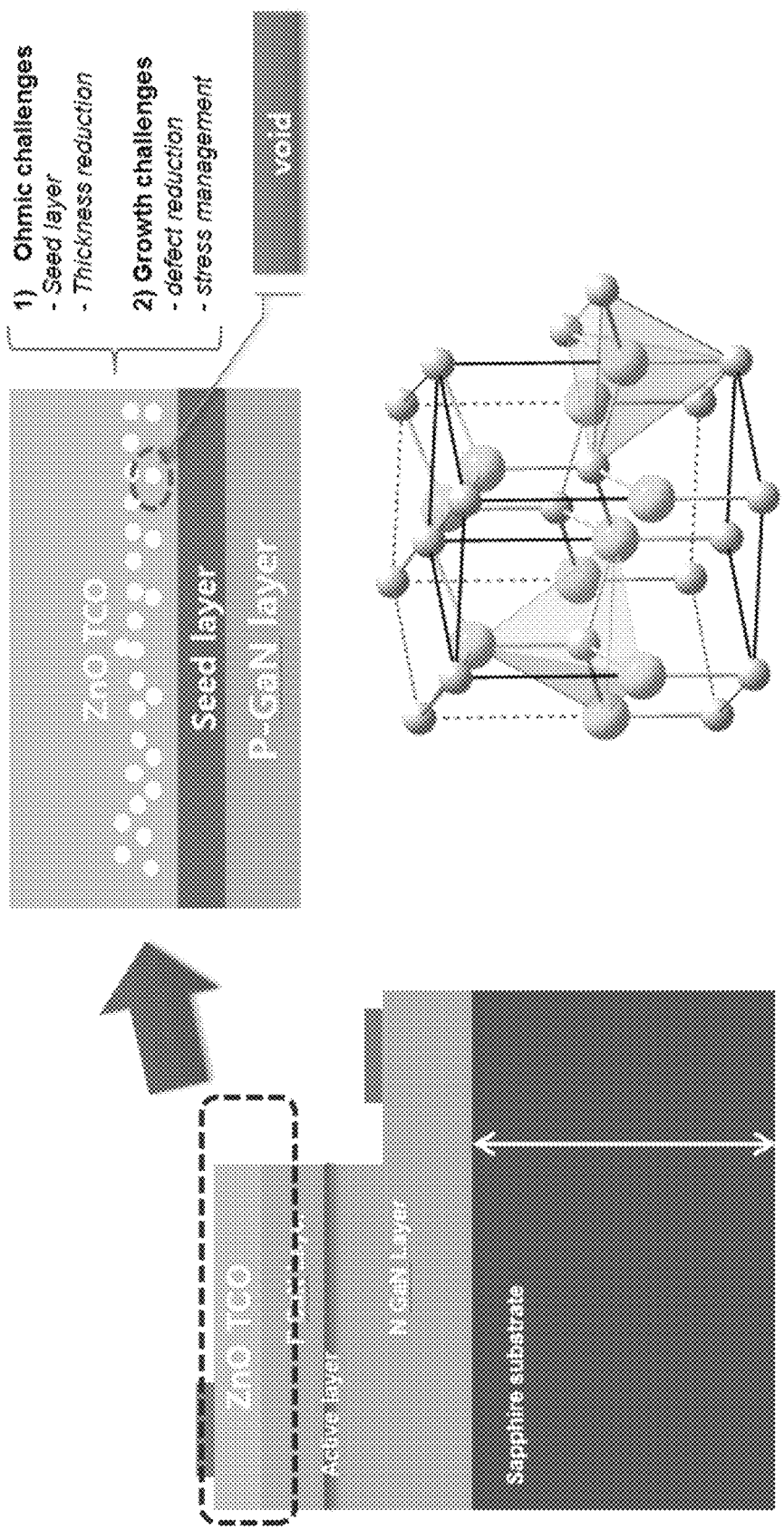
FIG. 1 shows an exemplary ZnO based LED device.

Techniques, systems, and devices are described for implementing a zinc oxide (ZnO) based light emitting diode. Headings are used in the description to facilitate understanding of the technology and do not limit the scope of the described techniques. The term "exemplary" is used in the sense of "an example of" and may not mean that the described subject matter is ideal or preferred from all possibilities.

Various implementations are provided to improve the performance of III-N LED devices by using a ZnO layer in the LED devices. The ZnO layer can improve the light extraction, heat dissipation, and current distribution (current spreading) of the device. Due to growing energy concerns, efficient LED lighting technology is of current and expanding importance. However, the cost of LED lighting remains high and is a major impediment to the greater implementation of the technology. In one advantageous aspect, the disclosed technology is intended to allow the power output, light extraction efficiency, and brightness of III-Nitride light emitting diode devices to be increased without substantially increasing the cost of the device. This can be achieved by providing an improved technology to provide the ZnO based LED device. The disclosed ZnO based LED device exhibits the improved performance as compared to other current spreading layers, e.g. ITO or Ni/Au layer, while using an inexpensive raw material, i.e. ZnO, and a low cost deposition method, i.e. low temperature aqueous deposition.

ZnO is an attractive material for use as current spreading layers in III-Nitride based light emitting diode devices for multiple reasons. The two materials are structurally and thermally compatible, which allows for the epitaxial growth of ZnO films on III-N surfaces. Zinc oxide is easily produced with high n-type conductivity, which enables a ZnO film to spread current across the surface of a light emitting diode device. ZnO is also highly transparent across the entire spectrum of visible light, which prevents absorption of the light generated by the light emitting diode device. A valence band offset of 1.3 eV compared to GaN allows for the possibility of tunneling current across a p-type GaN and ZnO junction, thus providing an Ohmic electrical contact between p-type GaN and ZnO. Furthermore, ZnO selectively etches in various acids, allowing for light extraction structures to be easily created.

III-nitrides may be referred to as group III-nitrides, nitrides, or by (Al,Ga,In)N, AlInGaN, or Al(1-x-y)InyGaxN where $0<x<1$ and $0<y<1$, for example. These terms are intended to be broadly construed to include respective nitrides of the single species, Al, Ga, and In, as well as binary, ternary and quaternary compositions of such Group III metal species. Accordingly, the terms comprehend the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the technology. Accordingly, it will be appreciated that the discussion of the technology hereinafter in primary reference to GaN materials is applicable to the formation of various other (Al, Ga, In)N material species. Further, (Al,Ga,In)N materials may further include minor quantities of dopants and/or other impurity or inclusional materials. Boron may also be included in the III-nitride alloy.

Similarly, the terms zinc oxide or ZnO are intended to be broadly construed to include any material where the component species Zn and O make up the majority of the compound, and the material retains the hexagonal Wurtzite crystal structure of ZnO. This is inclusive of aluminum doped zinc oxide (AZO), gallium doped zinc oxide (GZO), and indium doped zinc oxide (MO). This also includes materials with minor quantities of other dopants and/or other impurity or inclusional materials, as well as materials that are off-stoichiometric due to the presence of vacancy and interstitial type material defects.

Examples of LED Devices with ZnO Layer and Fabrication Methods Thereof

FIG. 1 illustrates an exemplary ZnO based LED device. The GaN-based LED device includes a substrate, n-type GaN layer, p-type GaN layer, an active layer between the n-type GaN layer and the p-type GaN layer, and a ZnO layer. The active layers in these structures are generally intrinsic GaN with lower-bandgap $In_xGa_{1-x}N$ quantum wells for increased carrier localization and recombination efficiency. The prevailing technique used to grow these structures is metallorganic chemical vapor deposition (MOCVD), which employs precursor gases which form crystalline layers in the presence of a heated crystal substrate. Substrates used for MOCVD GaN device fabrication include sapphire, SiC, bulk GaN wafers, and Si wafers.

In some implementations, a ZnO based LED device can allow the substrate to have a greater size than those in the conventional LED devices. For example, the substrate has a diameter greater than 4 inch. In some implementations, the ZnO based LED device is formed on a chip having a chip size greater than 950×500 µm.

The ZnO layer is formed over the p-type GaN layer to include a ZnO seed layer and a ZnO bulk layer. The ZnO layer including the ZnO seed layer and the ZnO bulk layer is formed and configured to enhance the electrical and/or optical properties of the ZnO based LED device.

Figure 2:
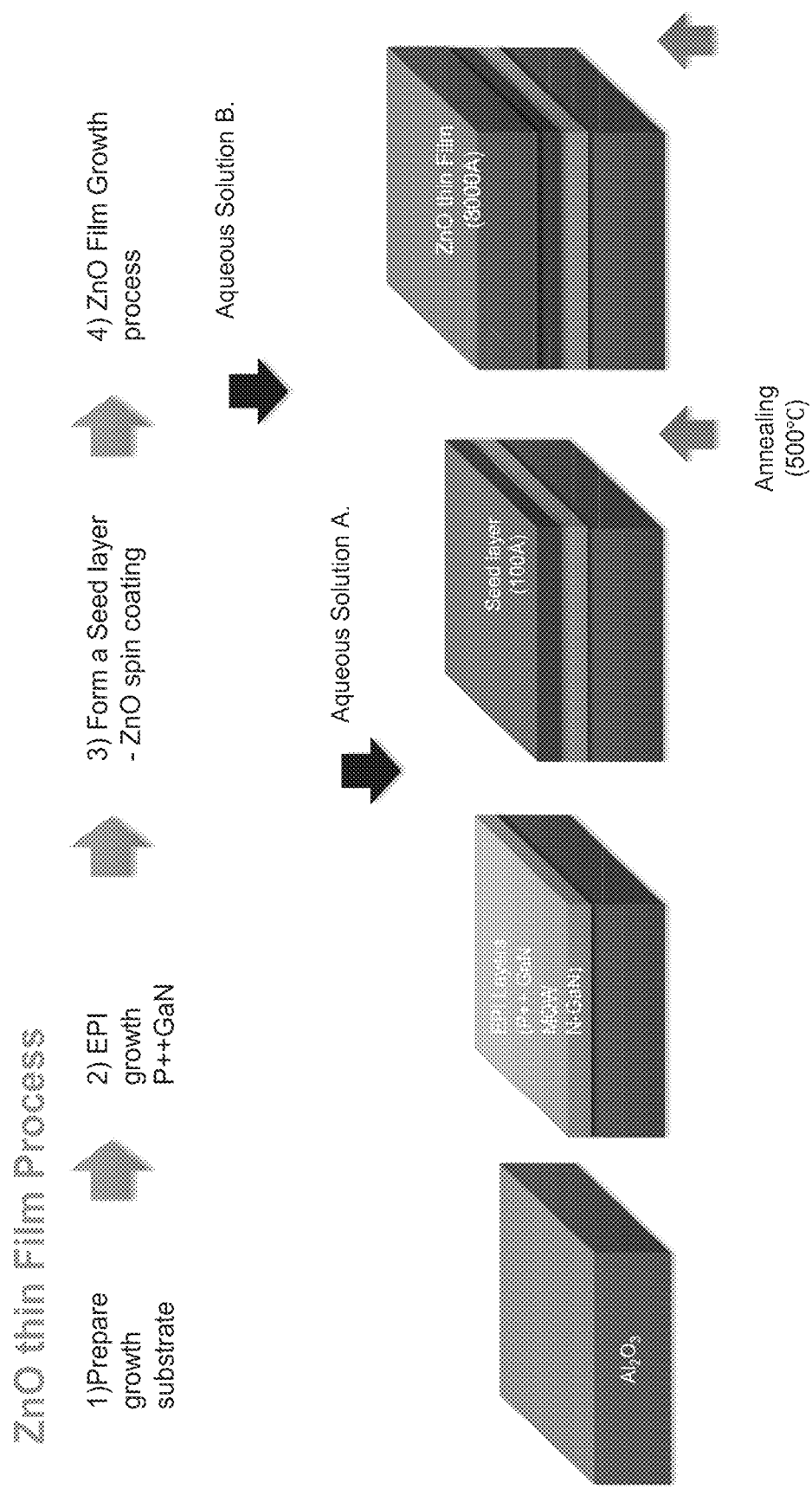
FIG. 2 illustrates an exemplary manufacturing process for a ZnO layer.

FIG. 2 illustrates an exemplary manufacturing process for a ZnO layer. As shown in FIG. 2, the manufacturing process includes preparing a growth substrate, providing a epitaxial layer (e.g., a GaN stack layer including n-type GaN layer, p-type GaN layer and an active layer), forming a ZnO seed layer by a spin coating using an aqueous solution, and growing a ZnO bulk layer using an aqueous solution. As shown in FIG. 1, in the disclosed technology, a two-step hydrothermal synthesis process is performed to deposit a single crystal ZnO structure including the ZnO seed layer and the ZnO bulk layer. In the first step, conditions are used to deposit a thin continuous or contiguous ZnO seed layer on the p-type GaN of the III-N LED device. The second step is performed to grow the ZnO bulk layer extended from the ZnO seed layer.

Figure 3A:
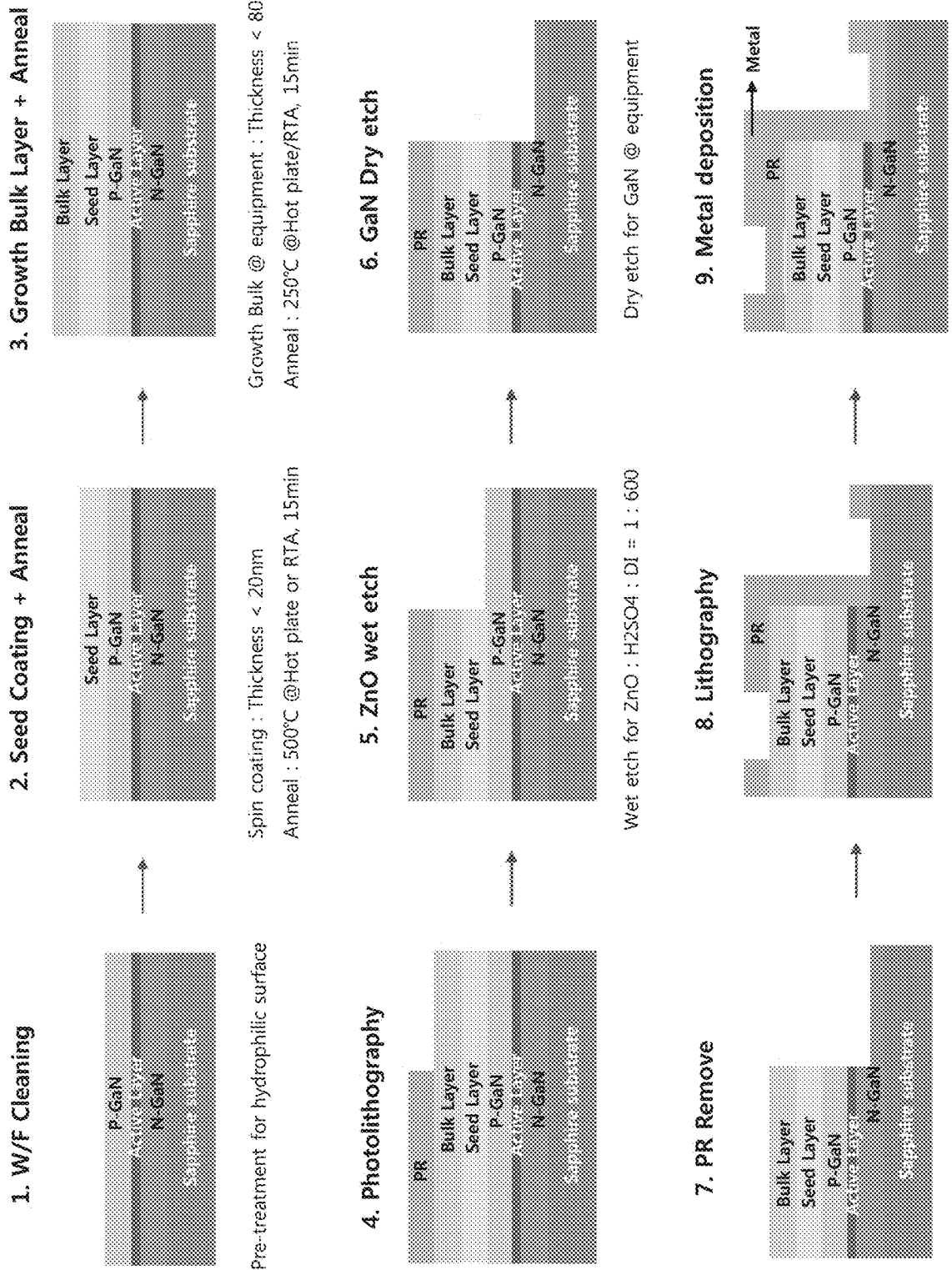

FIGS. 3A and 3B illustrate more details of a manufacturing process for the ZnO based LED device. Referring to FIG. 3A, at the first step, the GaN stack including n-type GaN layer, p-type GaN layer, and an active layer between the n-type GaN layer and the p-type GaN layer is formed over a substrate. The active layer can include generally intrinsic GaN with lower-bandgap $In_xGa_{1-x}N$ quantum wells for increased carrier localization and recombination efficiency. The prevailing technique used to grow the GaN stack structures is metallorganic chemical vapor deposition (MOCVD), which employs precursor gases which form crystalline layers in the presence of a heated crystal substrate. A substrate used for MOCVD GaN device fabrication includes sapphire, SiC, bulk GaN wafers, or Si wafers. In some implementations, the substrate (for example, a wafer) can have a greater size (such as greater than 4 inch diameter) than those manufactured by conventional manufacturing process.

In some implementations of the disclosed technology, after the forming of the GaN stack and before forming a ZnO seed layer, hydrophilicity treatment is performed on a surface of the GaN stack to provide a hydrophilic surface. The hydrophilicity treatment includes an application of a hydrophilicity treatment liquid to the surface of the GaN stack, thereby making the surface hydrophilic. The hydrophilicity treatment liquid may include an aqueous liquid which comprises a compound having at least one hydrophilic group. The hydrophilic surface helps a seed layer to be formed over the GaN stack to have better continuity that is not available in conventional ZnO based LED devices.

At the second step, a ZnO seed layer is formed over the GaN stack having the hydrophilic surface using the aqueous solution (hereinafter "seed layer solution"). In some implementations, the seed layer may be formed by a spin coating. As compared to a dipping method where the substrate is dipped into a vessel, the spin coating allows the ZnO seed layer to be formed at a constant speed and thus, the ZnO seed layer can be formed to have a desired thickness. The ZnO seed layer may have a thickness not greater than 20 nm. In some implementations, since the hydrophilicity treatment is performed before the forming of the ZnO seed layer, the seed layer can be formed to be contiguous. The contiguous ZnO seed layer provides the lower contact resistance with the GaN stack structure (e.g., p-type GaN layer). In some implementations, the ZnO seed layer occupies at least 90% of the total surface of the underlying layer. In some implementations, the ZnO seed layer occupies at least 95% of the total surface of the underlying layer. Examples of the seed layer solution and processing condition for forming the ZnO seed layer are shown in FIG. 4A. In forming the seed layer, the seed layer solution is supersaturated, which makes PH level of the seed layer solution much greater than that used in conventional arts. Such great PH level of the seed layer can help a ZnO bulk layer to be easily and better formed over the ZnO seed layer. The annealing process is performed on the ZnO seed layer, for example, under 500° C. and for 15 minutes.

At the $3^{rd}$ step, a ZnO bulk layer is formed over the ZnO seed layer using another aqueous solution (hereinafter "bulk layer solution"). Examples of the bulk layer solution and processing condition for forming the ZnO bulk layer are shown in FIG. 4B. The forming of the ZnO bulk layer proceeds while the substrate is rotated along a vertical direction within a chamber. Such wafer rotation also allows the growth speed to be constant during the forming of the ZnO bulk layer and thus, the ZnO bulk layer can be formed to have a desired thickness. In some implementations, the ZnO bulk layer has a thickness less than 800 nm.

During growing of the bulk layer, pH level is not separately controlled. Thus, the pH level during the forming of the seed layer is greater than that during the growing of the bulk layer. In some implementations of the disclosed technology, the forming of the ZnO bulk layer may include intentionally introducing voids to the ZnO bulk layer and controlling voids of the ZnO bulk layer. The voids distributed in the ZnO bulk layer provide air gaps that affect refractive index of the ZnO bulk layer, which results in the increase of extraction efficiency. Further, the controlling of the voids can proceed to vary the amount of the voids and/or the distribution of the voids to further enhance optical properties of the ZnO based LED device. After the ZnO bulk layer is formed, the annealing process is performed on the ZnO bulk layer, for example, under 250° C. and for 15 minutes. After the annealing, the ZnO bulk layer forms a single (or better) crystal structure with the ZnO seed layer, thereby providing a single crystal ZnO structure including a bottom single crystal ZnO portion including the ZnO seed layer and a top single crystal ZnO portion including the ZnO bulk layer.

At the 4th step, a photoresist is formed over the bulk layer. At the 5th step, single crystal ZnO structure is etched by, for example, wet etching. At the time of the etching, since the ZnO seed layer and the ZnO bulk layer form the single crystal structure, the single crystal ZnO structure can have an inverse mesa structure. At the $6^{th}$ step, the GaN structure is etched by, for example, dry etching. In FIGS. 3A and 3B, although the ZnO based LED device has been shown to have a mesa structure, other implementations are also possible. For example, the ZnO based LED device can be etched to have a lateral type structure or vertical type structure.

At the 7th step, the photoresist is removed by using a PR remover. It is observed that the conventional PR remover which includes an alkarine composition causes damages to the ZnO structure. Thus, a new photoresist (PR) remover is selected so that the damages to the single crystal ZnO structure are reduced. The new PR remover includes propylene glycol monomethyl ether, alcohols, C12-14, ethoxylated, 1-metil-2-pirrolidona, additives, or DI water. FIG. 5 shows tables comparing the conventional PR remover and the new PR remover. In FIG. 5, each chemical substance indicates a class of a group rather than a specific chemicals. Through the experiments, it has been confirmed that the listed chemical substances, Propylene Glycol Monomethyl Ether, Alcohol, C12-14-Secondary, Ethoxylated, and 1-Methyl-2-Pyrrolidinone do not cause any damages to the ZnO structure.

Referring back to FIG. 3B, further processes are performed in the $8^{th}$ step through the $14^{th}$ step, thereby providing the ZnO based LED device including the single crystal ZnO structure. The ZnO based LED device manufactured according to the proposed steps have improved properties in terms of light extraction efficiency, light loss, contact resistance, etc.

The ZnO seed layer is formed to have a uniform distribution and density of sites for the ZnO bulk layer to be grown. The ZnO seed layer is hydrophilicity treated to provide a continuous or contiguous surface of the ZnO seed layer. In some implementations, the ZnO seed layer occupies more than 90% of the total surface of the underlying layer. In some implementations, the ZnO seed layer occupies more than 95% of the total surface of the underlying layer. In some implementations, the seed layer is undoped.

FIG. 6 illustrates the hydrophilicity treated seed layer (bottom portion) together with the conventional seed layers (upper portion) for which the hydrophilicity treatment has been performed. The hydrophilicity treatment can allow the seed layer to have the continuous or contiguous surface. Thus, the seed layer forms the single crystal structure with the ZnO bulk layer formed over the seed layer.

Figure 7:
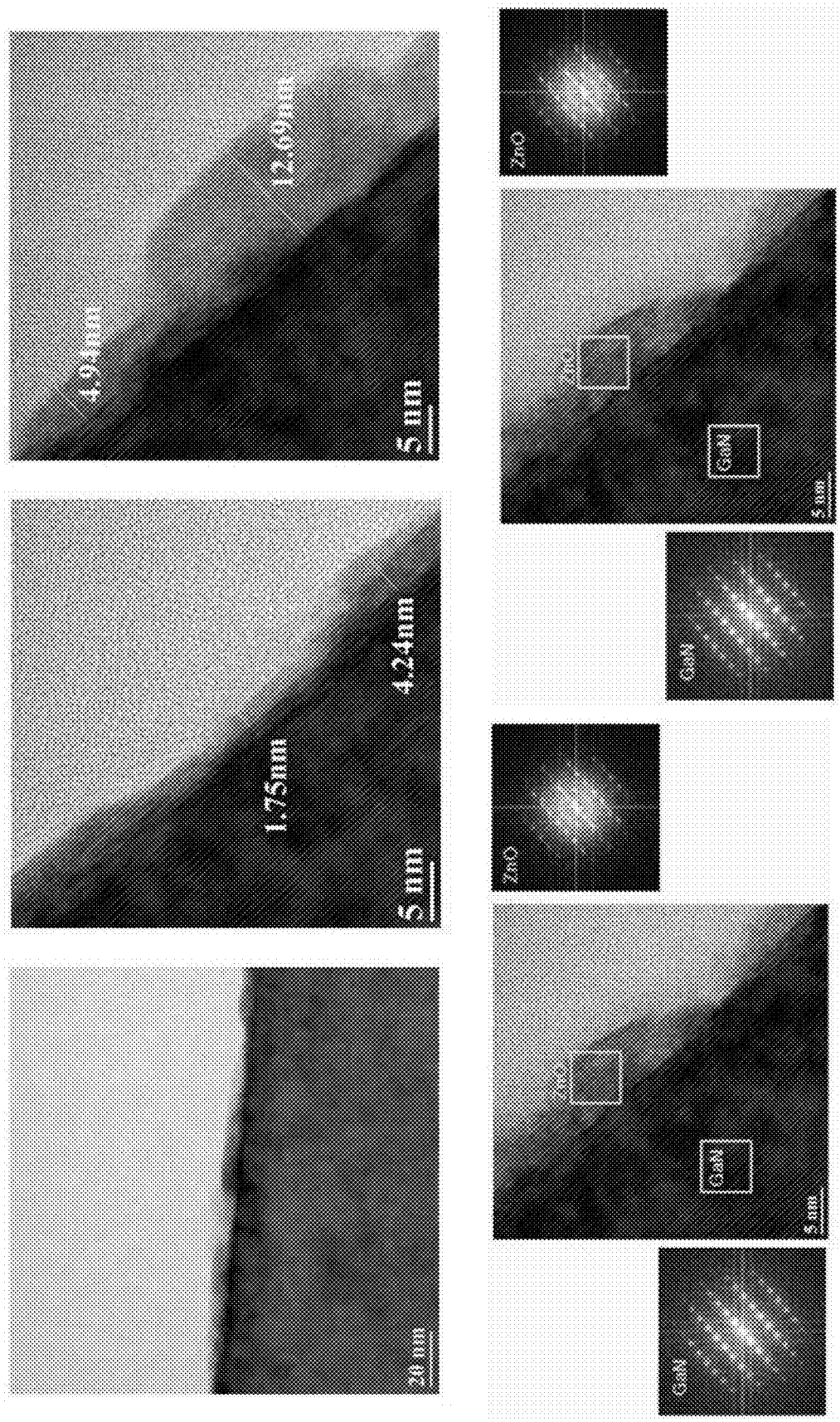
FIG. 7 illustrates exemplary images of a seed layer before a ZnO bulk layer is formed.

FIG. 7 illustrates the images of the seed layer before the ZnO bulk layer is formed.

Figure 8:
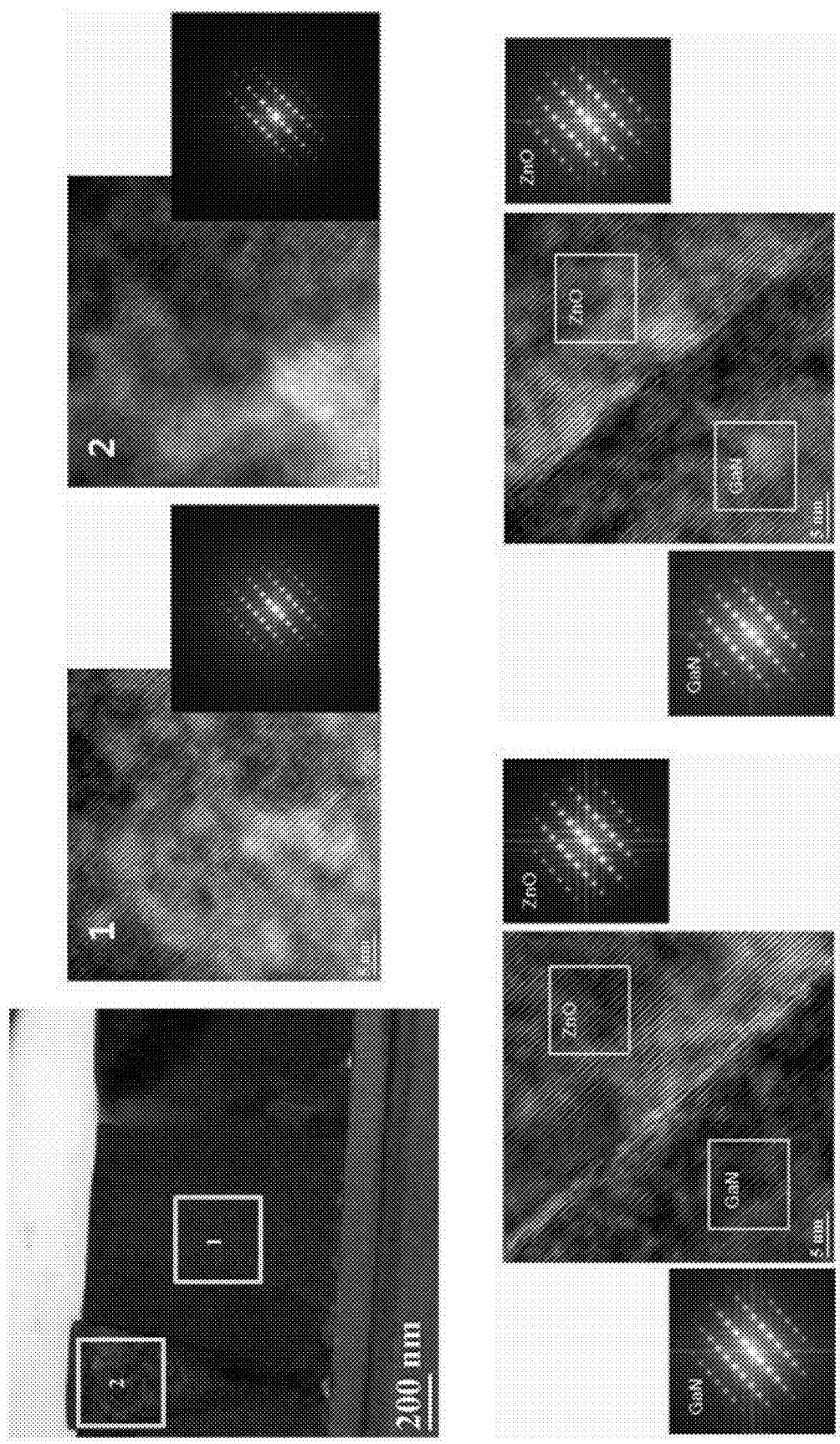
FIGS. 8 and 9 illustrate exemplary images of the seed layer after the ZnO bulk layer is formed.
Figure 9:
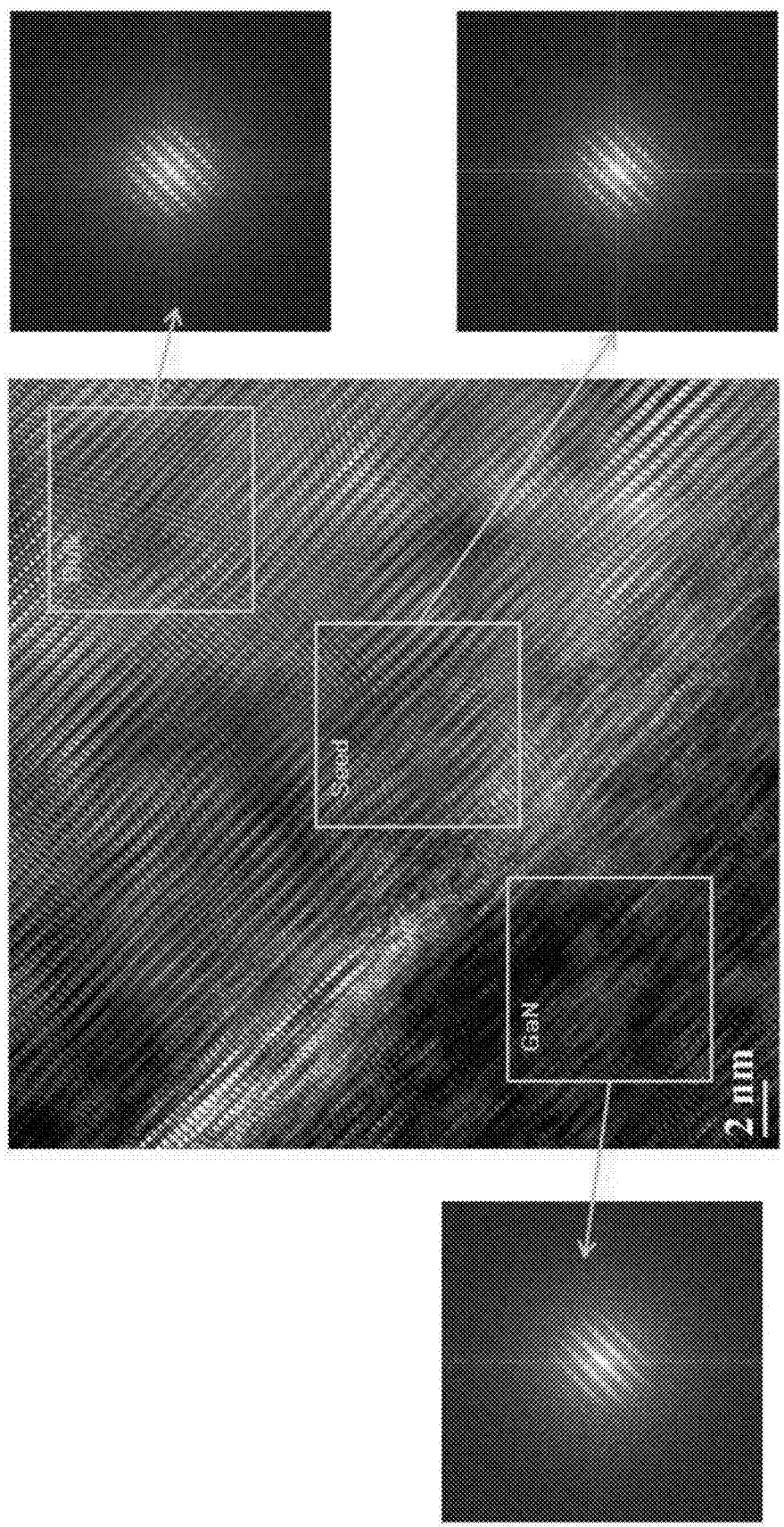

FIGS. 8 and 9 illustrate the images of the seed layer after the ZnO bulk layer is formed. Referring to FIGS. 7 to 9, the seed layer itself has the poly crystal structure but forms the single crystal structure with the ZnO bulk layer after the ZnO bulk layer is formed.

Figure 10:
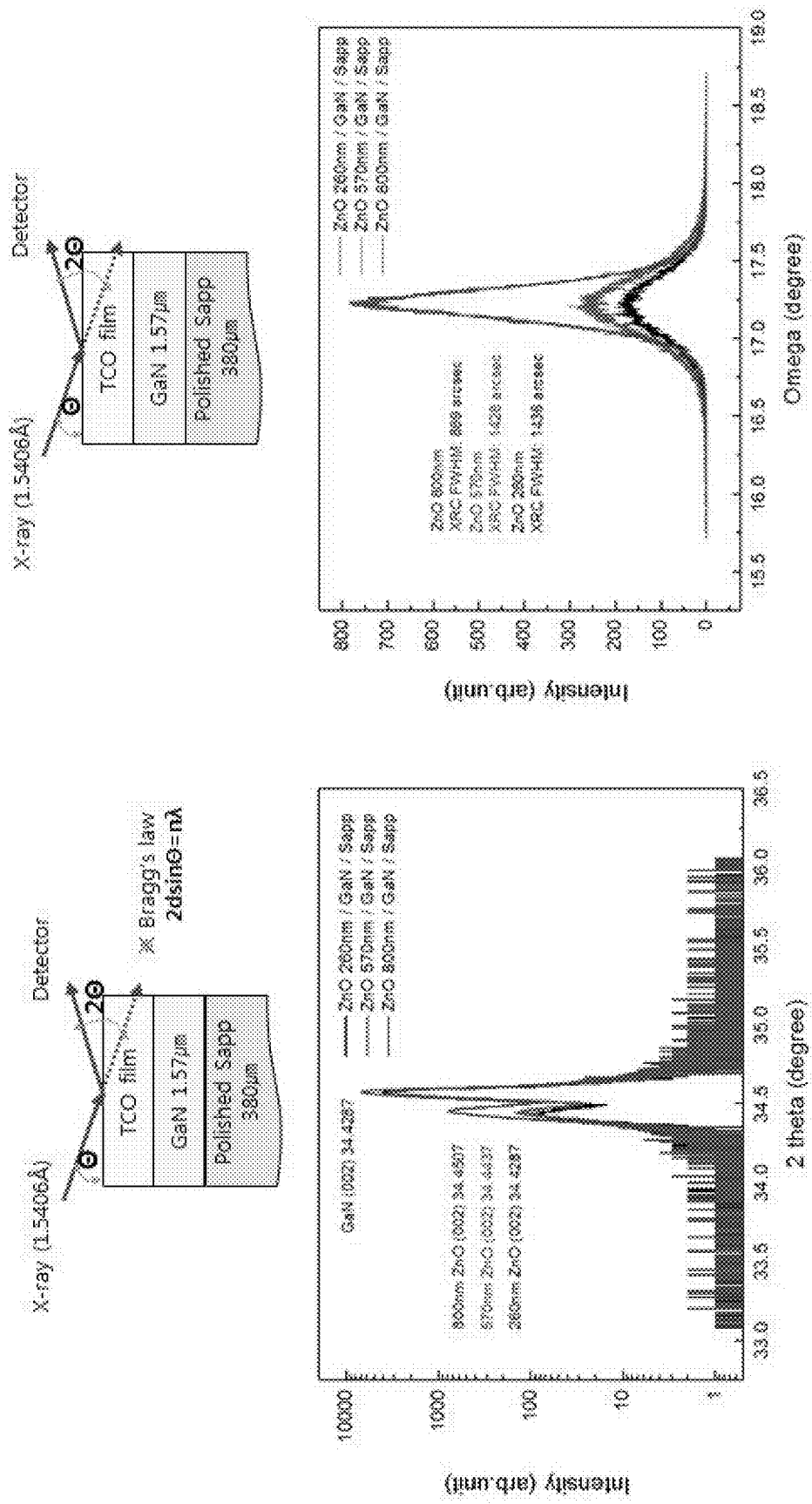
FIGS. 10 and 11 illustrate graphs showing a single crystal structure of an ZnO layer including a ZnO seed layer and a ZnO bulk layer.
Figure 11:
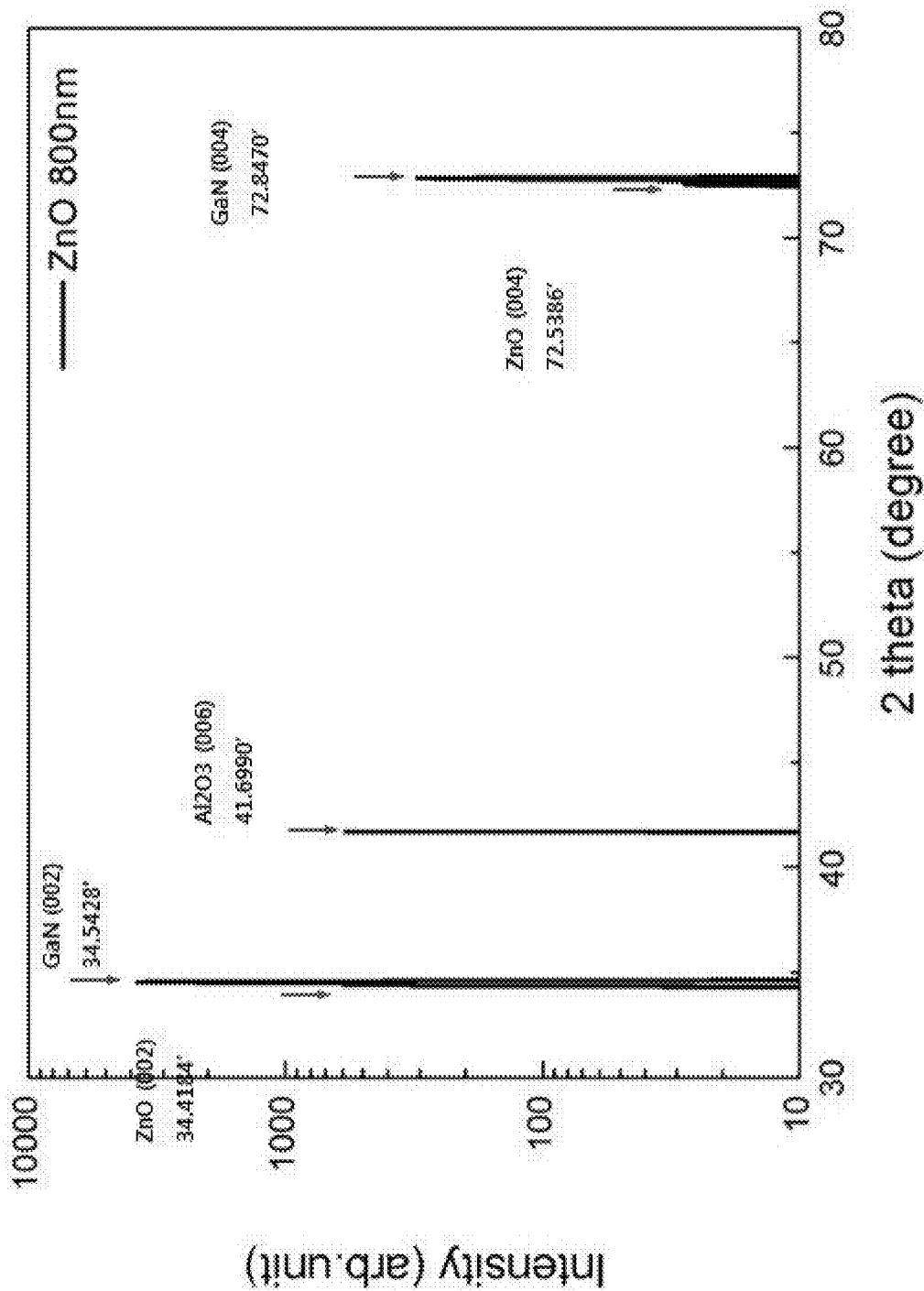

In addition, FIGS. 10 and 11 additional graphs showing the single crystal structure of the ZnO layer.

In some implementations, the ZnO seed layer is free of citrate. A citrate is a derivative of citric acid and exists as a positive ion. Thus, the citrate tends to combine with Zn that exists as a negative ion, which prevents the formation of ZnO. Thus, by configuring the ZnO seed layer to be free of citrate, it is possible to facilitate and help the formation of the ZnO bulk layer. In some implementations, the ZnO seed layer has a thickness less than or equal to 200 angstrom (Å), for example, 100 angstrom (Å).

The ZnO bulk layer is grown from the ZnO seed layer. As discussed above, since the ZnO seed layer and the ZnO bulk layer form the single crystal structure, at the time of etching of the ZnO layer, the ZnO layer has an inverse mesa structure. This is shown in FIG. 12 shows the sidewall of the ZnO layer having an inverse mesa structure. Referring to FIG. 12, unlike the underlying layer, the ZnO layer has the inverse mesa structure. The ZnO bulk layer is directly contact with the ZnO seed layer without any current blocking layers therebetween. In some implementations, the ZnO bulk layer is doped with Ga.

Figure 13:
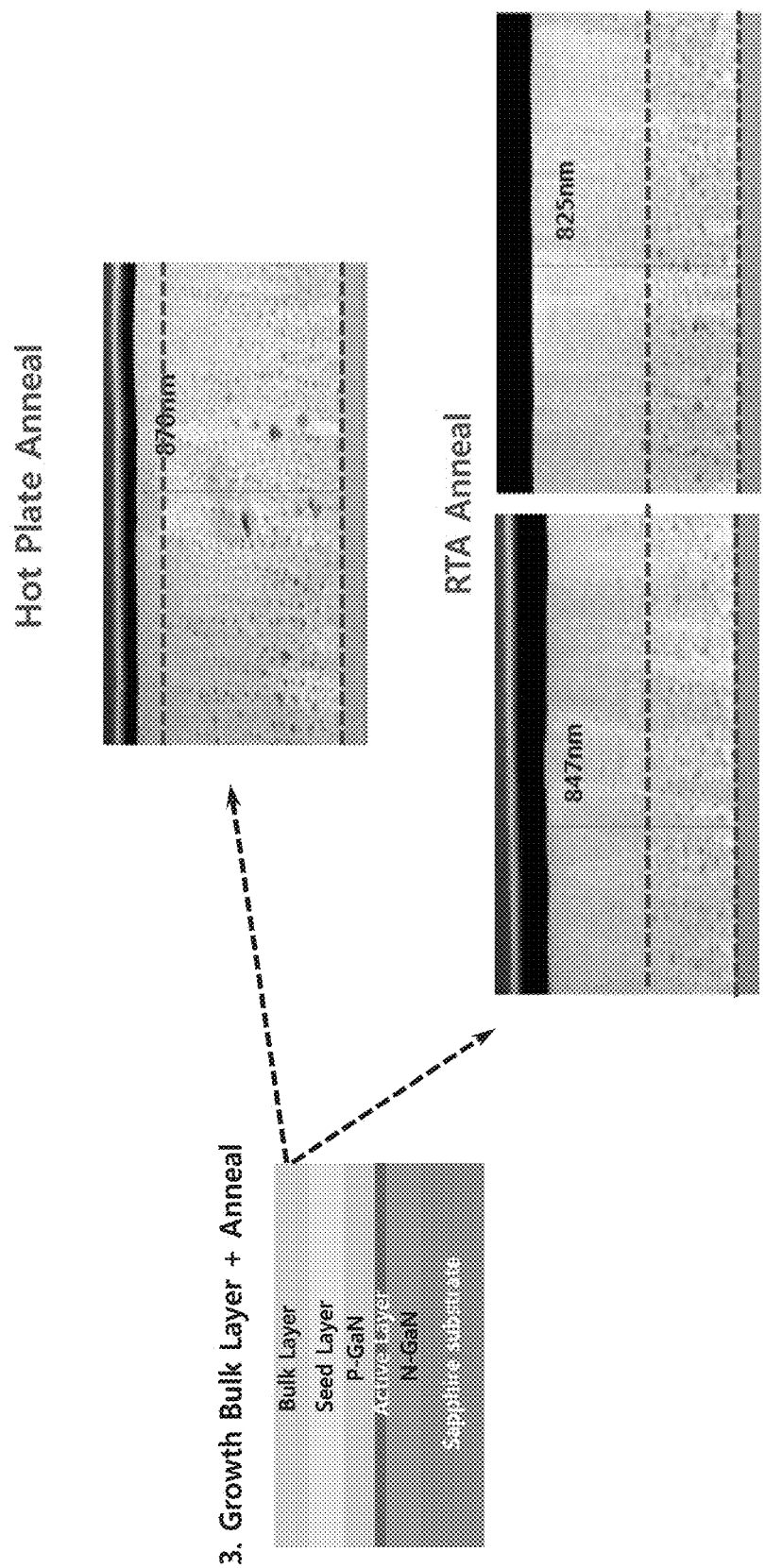
FIG. 13 shows exemplary images of a ZnO bulk layer having voids distributed inside the ZnO bulk layer.
Figure 15:
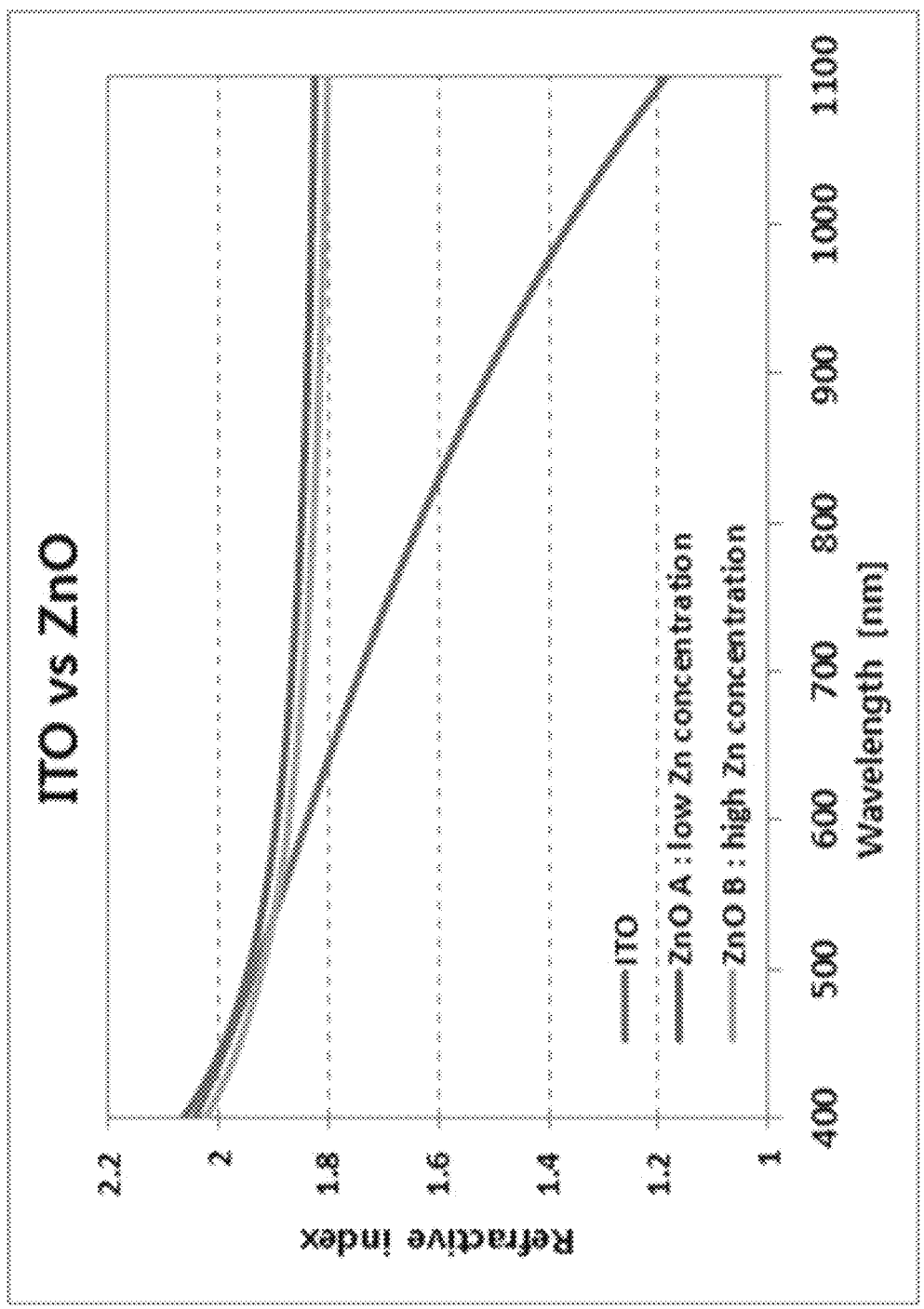
Figure 16:
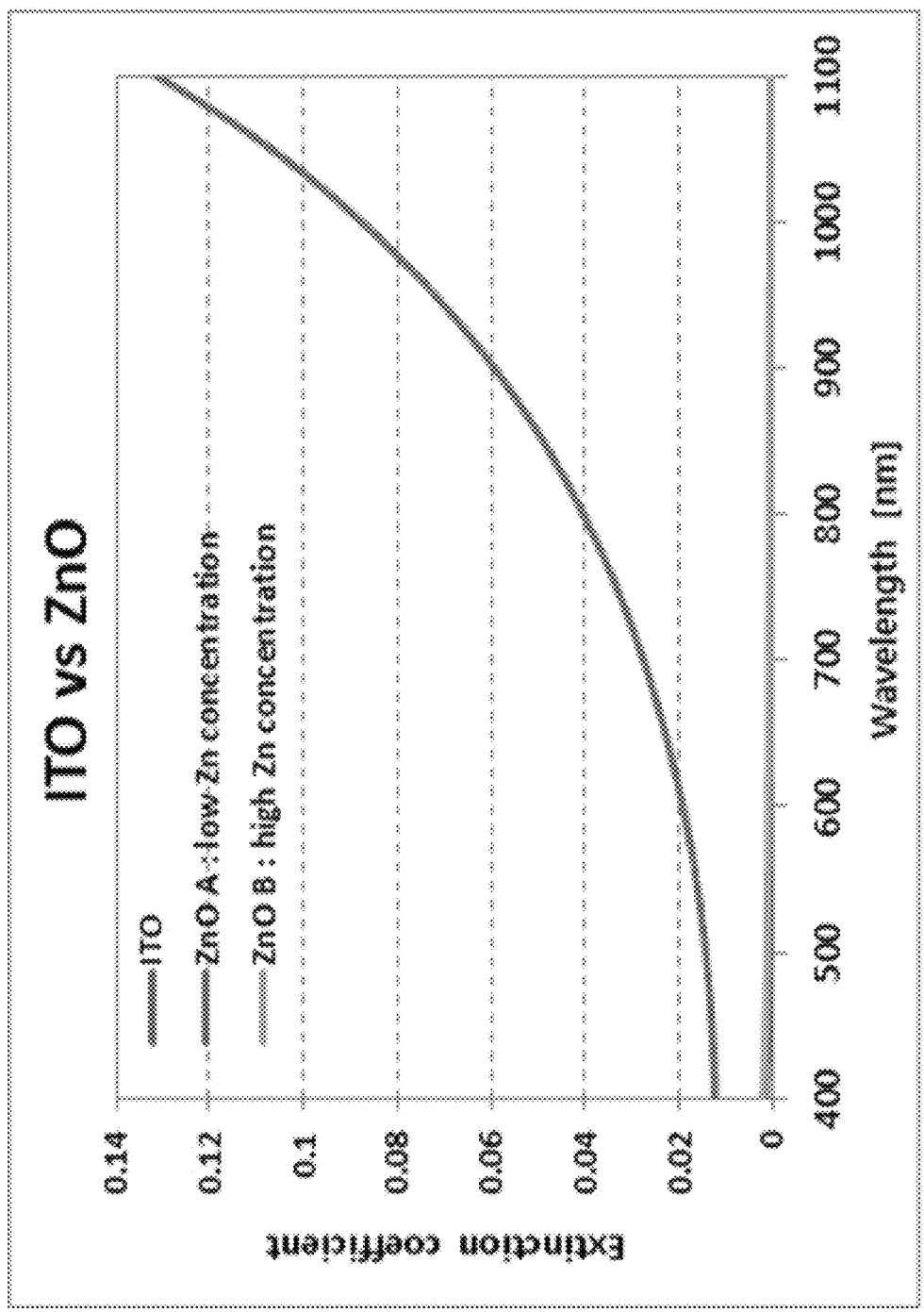
Figure 18:
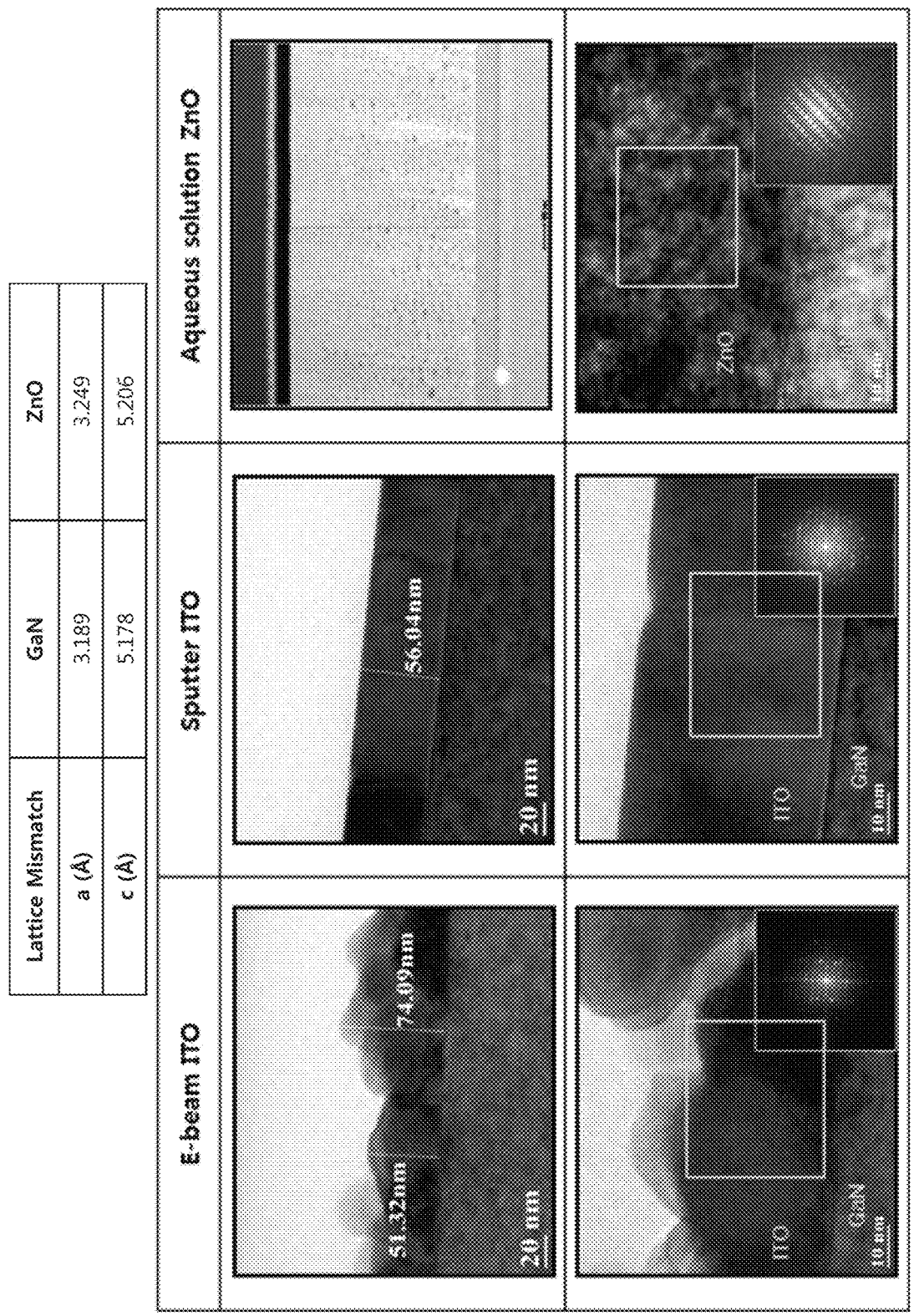

In the disclosed technology, the voids are intentionally introduced to the ZnO bulk layer and controlled to enhance optical properties of the ZnO based LED device. The voids can have various shapes and make the ZnO bulk layer porous. FIG. 13 shows the images of the ZnO bulk layer having the voids distributed inside the ZnO bulk layer. The upper right image shows the ZnO bulk layer after performing a hot plate annealing and the lower right images show the ZnO bulk layer after performing a RTA annealing. The voids distributed in the ZnO bulk layer provide air gaps that affect refractive index of the ZnO bulk layer, which results in the increase of extraction efficiency. Thus, the existence of the voids inside the ZnO bulk layer can provide improved extraction efficiency of the ZnO based LED device.

FIG. 14 explains how the voids help the ZnO based LED device to have the improved extraction efficiency based on density of the voids of the ZnO bulk layer. Referring to FIG. 14, total 88.17% of light is obtained at an output side of the ZnO based LED device without voids, while total 89.16% of light is obtained at an output side of the ZnO based LED device with voids. Thus, the voids help to get more light extracted from the device. This is different from the conventional knowledge that the voids need to be avoided since the voids deteriorate the crystal quality. In some implementations, the voids can be controlled to provide more improved optical properties of the ZnO based LED device. In some implementations, range, position, or amount of the voids may be controlled. In some implementations, the voids can be uniformly distributed inside the ZnO bulk layer. The voids can have a thickness less than 8000 angstrom (Å). Thus, the voids have a thickness greater than at least 50 times that of the ZnO seed layer.

Figure 19:
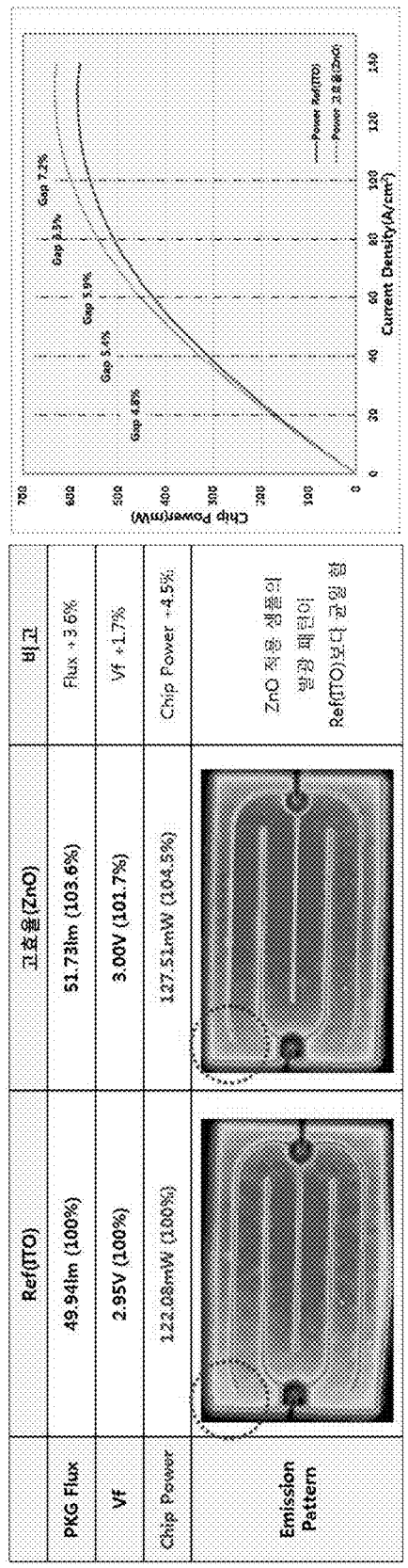
Figure 20:
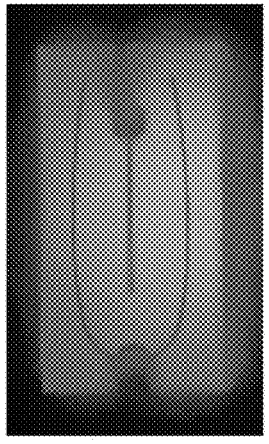

The electrical and optical output properties of one implementation of the disclosed technology were compared to otherwise identical III-Nitride light emitting diode devices using ITO. The comparison results are shown in FIGS. 15 through 18. In the ZnO based LED device, which represents an embodiment of the disclosed technology, an operating voltage less than 3 Vf was required and at an operating current of 50 mA, the optical output power of was 130 mW. FIGS. 19 through 21 show the device performance and reliability of the ZnO based LED device. Referring to FIG. 21, Au STEM Reliability Test shows that for 100 mA, it shows reliable performance in comparison with ITO after 1000 hour at the room temperature. 5630D Reliability Test shows reliable on or off performance in comparison with ITO after 1000 hours at the room temperature. The BST evaluation (PAD Adension) also shows that the performance is better than ITO by 12% improvement.

Examples of Device and Method Thermal Hydro-Synthesis of Semiconductor Materials GaN-based LEDs and other optoelectronic devices (e.g., such as lasers) typically include three main layers, which are epitaxially formed on a crystal substrate (e.g., such as sapphire, SiC, bulk GaN wafers, or (111) Si wafers). These layers include an n-type GaN:Si layer, a p-type GaN:Mg layer, and a light-emitting "active region" in-between. Active regions in these structures are generally intrinsic GaN with lower-bandgap $In_xGa_{1-x}N$ quantum wells for increased carrier localization and recombination efficiency. The prevailing technique used to grow these structures is metalorganic chemical vapor deposition (MOCVD), which uses precursor gases to form crystalline layers while heating via a heated crystal substrate.

Conventional methods to produce ZnO layers on GaN stacks (e.g., the n-type GaN layer, the p-type GaN layer, and the active region) have included MOCVD, molecular beam epitaxy (MBE), and hydrothermal synthesis techniques, all with variable levels of success and significant limitations. For example, in the case of hydrothermal synthesis for growing ZnO layers, such techniques have been reliable in producing high-quality bulk single-crystals of ZnO, but with low carrier concentrations and low electrical conductivities, which are not suitable for applications as a transparent contact for GaN-based LED or optoelectronic device applications. Moreover, for growing ZnO layers on p-type GaN, it is important that the semiconductor layered substrate is not exposed to conditions that could compromise or damage the sensitive p-type GaN layers, e.g., such as hydrogen annealing for increasing the carrier concentration of ZnO.

Thermal hydro-synthesis (THS) devices, systems, and methods are disclosed for forming layers of semiconductor materials to produce optoelectronic devices. In some aspects, a device for producing a ZnO layer on GaN layer (e.g., p-type GaN layer) is disclosed.

Figure 22:
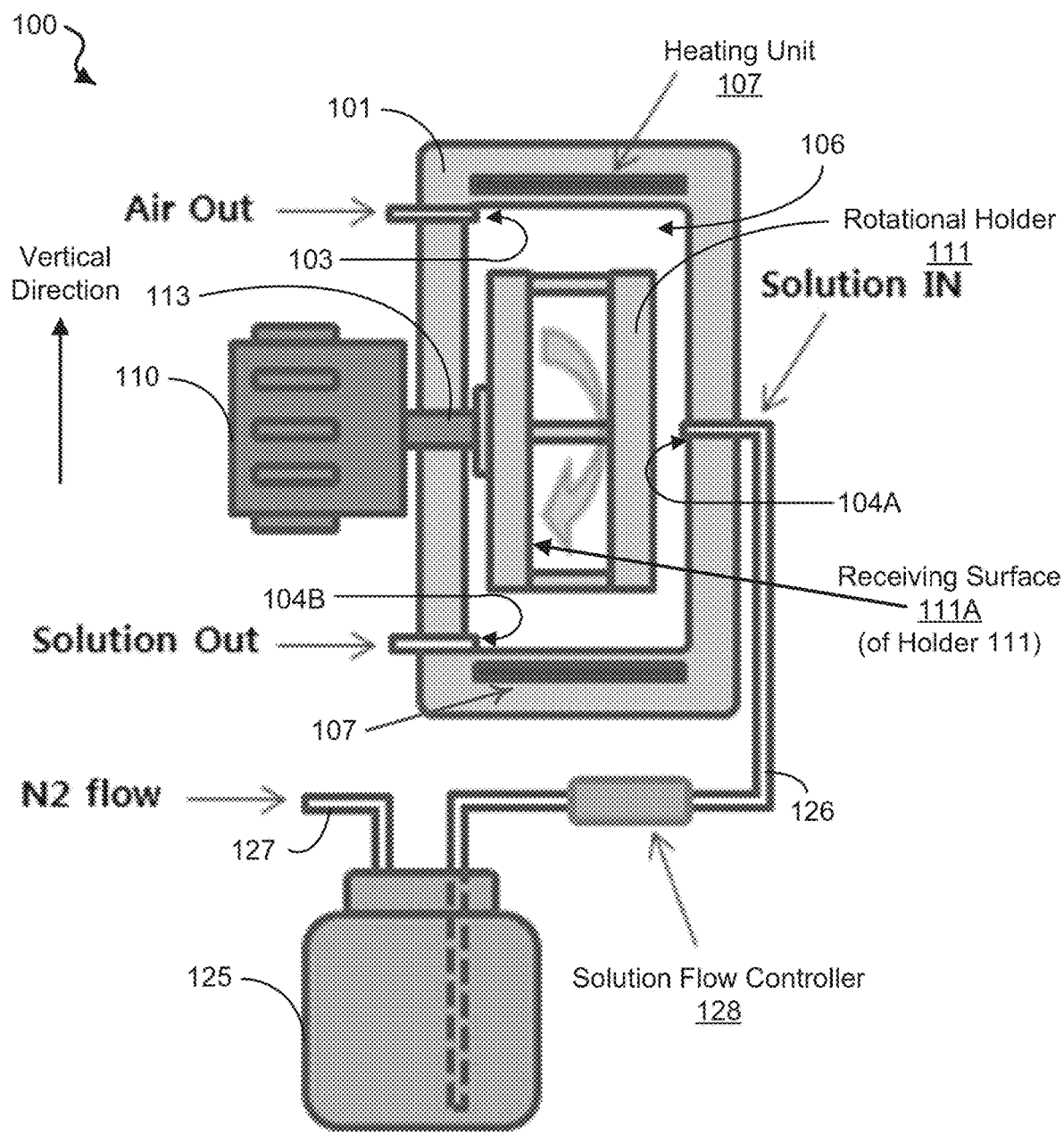
FIG. 22 shows a diagram of an example device to fabricate optoelectronic devices.

FIG. 22 shows an illustrative schematic of an example fabrication device 100 to produce optoelectronic devices, e.g., such as forming a ZnO layer on a GaN layer. The device 100 includes a housing 101 to contain or provide support to the components of the device 100. The housing 101 can be configured to have a variety of shapes and sizes, and include various materials to form its structure to provide sufficient strength, support, electrical conductivity and insulation, and insulation and/or dissipation of heat to the device 100. The housing 101 structured to include an interior chamber 106 able to be sealed and contain a liquid medium.

The housing 101 includes access openings (e.g., channel between the interior chamber 106 and the exterior of the housing) located at positions along the interior chamber 106 to allow fluid (e.g., gas, liquid) to enter and exit the interior chamber 106 of the device 100. The housing 101 includes an opening 104A to provide the solution including semiconductor constituents for growing semiconductor layers into the interior chamber 106 of the device 100. For example, as shown in FIG. 22, the opening 104A is positioned about the center of the interior housing 106 with respect to the vertical direction. The housing 101 includes an opening 104B to allow the solution to exit the interior chamber 106. For example, the opening 104B is positioned about the bottom of the interior housing 106. The housing 101 includes an opening 103 to allow gas (e.g., air) to exit the chamber. The device 100 can include valves positioned at a terminus or within the openings 103, 104A, and/or 104B to control the inflow and outflow of the fluid from the interior chamber 106.

The device 100 includes a heating mechanism 107 to generate heat into the interior chamber 106. For example, the housing 100 can include one or more compartments to provide the heating unit 107 proximate to the interior chamber 106. The heating unit 107 is operable to regulate the temperature of the fluid within the interior chamber 106. The heating unit 107 can be positioned at various locations with respect to the interior chamber 106. In the example embodiment shown in FIG. 22, the heating unit 107 is positioned in an upper region and a lower region of the housing 101. For example, the heating unit 107 can include a heating wire electrically coupled to a power source to cause the heating wire, located in the upper and lower regions (e.g., compartments) of the housing 101, to direct heat into the interior chamber 106 (e.g., applied into the solution when filled into the chamber 106). In some implementations, for example, the device 100 includes one or more temperature sensors located at various locations along the interior chamber 106 to measure the temperature of the fluid, in which the measured temperature data can be used in regulating the temperature of the fluid by the heating unit 107. In some implementations of the heating unit 107, the temperature of the fluid can be heated and cooled by induction heating, Peltier effect, electric heating, or other.

The device 100 includes a rotational holder 111 disposed within the interior chamber 106 and oriented such that a receiving surface 111A to receive a sample or substrate upon which to fabricate semiconductor device layers has an orientation in a vertical direction. The device includes a motor 110 coupled to the rotational holder 111 and operable to drive rotational movement of the rotational holder 111 within the interior chamber 102. For example, the motor 110 can be coupled to the rotational holder 111 via a rotational drive shaft 113 extending from the central axis of the rotational holder 111 to the motor 110. For example, the motor 110 drives the rotational holder 111 to spin about its central axis at controlled and regulated speeds. In this orientation, the sample or substrate, e.g., such as a 4" wafer, is aligned such that the top surface of the waver is perpendicular to the vertical axis.

The device 100 includes a solution container 125 to store the solution to be provided into the interior chamber 106 during semiconductor device fabrication operations. The solution container 125 is structured to include an exterior casing with a hollow interior to contain the solution. The container 125 includes an opening, e.g., at the top of the exterior casing, from which fluid conduits (e.g., tubes, pipes, etc.) can pass. For example, the device 100 can include a fluid conduit 126 to transfer the solution from the container 125 to the interior chamber 106 through the opening 104A. In some implementations, for example, the device 100 includes a solution flow controller 128 to control the flow of the solution from the container 125 to the interior chamber 106 through the fluid conduit 126. For example, the device 100 can include a fluid conduit 127 to transfer gas (e.g., $N_2$ gas) into the container 125, e.g., to de-oxygenate the solution or otherwise affect or condition the solution.

The device 100 can include a data processing unit (not shown in FIG. 22) in communication with the motor 110 to control various operation parameters of the motor 110, e.g., including ON/OFF, rotational speed, etc. The data processing unit can also be implemented to control other features of the device 100, e.g., such as regulating the heating unit 107 via measured temperature data from the temperature sensor. The data processing unit includes a processor to process data and a memory in communication with the processor to store data. For example, the processor can include a central processing unit (CPU) or a microcontroller unit (MCU). For example, the memory can include processor-executable code, which when executed by the processor, configures the data processing unit to perform various operations, such as receiving information, commands, and/or data, processing information and data, and transmitting or providing information/data to another entity (e.g. external device). To support various functions of the data processing unit, the memory can store other information and data, such as instructions, software, values, images, and other data processed or referenced by the processor. Various types of Random Access Memory (RAM) devices, Read Only Memory (ROM) devices, Flash Memory devices, and other suitable storage media can be used to implement storage functions of the memory. The memory can store data and information of the data processing unit and other units of the device 100, e.g., including the heating unit 107, the temperature sensor, or other, as well as information about other systems and devices in communication with the device 100. For example, the memory can store device unit parameters, and hardware constraints, as well as software parameters and programs for operation on the device 100. The data processing unit includes an input/output (I/O) unit that can allow communicative connectability of the data processing unit to other units of the device 100. For example, I/O unit can provide the data processing unit to be in communications with other devices or systems, e.g., using various types of wired or wireless interfaces compatible with typical data communication standards, for example, including, but not limited to, Universal Serial Bus (USB), IEEE 1394 (FireWire), Bluetooth, Bluetooth Low Energy (BLE), ZigBee, IEEE 802.11 (Wi-Fi), Wireless Local Area Network (WLAN), Wireless Personal Area Network (WPAN), Wireless Wide Area Network (WWAN), WiMAX, IEEE 802.16 (Worldwide Interoperability for Microwave Access (WiMAX)), 3G/4G/LTE cellular communication methods, and parallel interfaces. The I/O unit 116 can also provide communicative connectability of the data processing unit 106 to an external interface, source of data storage, or display device. The I/O unit of the data processing unit can also interface with other external interfaces, sources of data storage, and/or visual or audio display devices, etc. to retrieve and transfer data and information that can be processed by the processor, stored in the memory, or exhibited on an output unit of the device.

The device 100 is operable to facilitate formation (e.g., growth) of a layer of a semiconductor material on the substrate during spinning of the holder immersed the solution within the interior chamber to produce a semiconductor material device. In some implementations of the device 100 for fabricating ZnO type GaN optoelectronic devices, for example, the holder 111 is loaded with a sample substrate to undergo a THS process. In some examples, the sample substrate can include a 4" wafer, or other size wafer, in which a GaN stack is disposed on an underlying substrate (e.g., sapphire) for the device to be fabricated. Upon loading the holder 111 and closing the housing 101 (e.g., sealing a hatch for loading/unloading of the holder, and operating valves to the openings 104A, 104B, and/or 103), the interior chamber 106 can be filled with the solution to hydrothermally grow ZnO layer on the GaN stack. The motor 111 can be operated, e.g., based on control via the data processing unit, to spin the substrate such that the GaN stack surface is oriented perpendicular to the axis of rotation, e.g., along a vertical direction. The heating mechanism 107 can be operated, e.g., based on control via the data processing unit, to regulate the temperature and heat distribution inside the chamber 106 during the spinning of the substrate on the holder 111 to facilitate controlled deposition and/or growth of the ZnO layer. In some implementations, gas may be provided during the operation via the opening 103.

Figure 23:
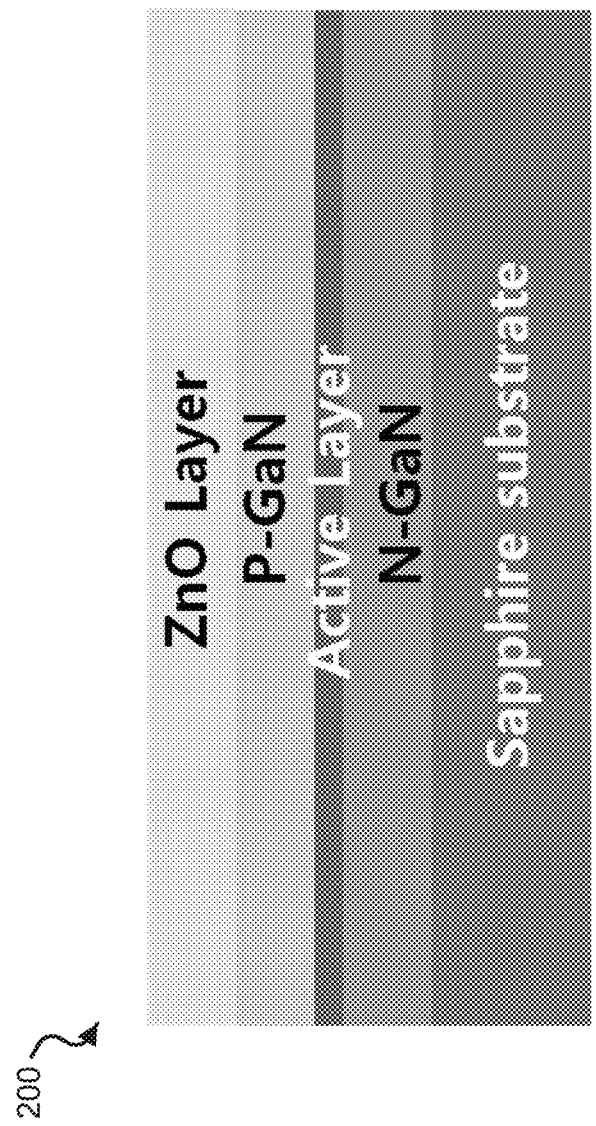
FIG. 23 shows a diagram of an example semiconductor material layered structure fabricated by the example device shown in FIG. 1.

FIG. 23 shows a diagram of an example semiconductor material layered structure 200 fabricated by the example device shown in FIG. 22. The structure 200 of FIG. 23 illustrates an exemplary ZnO based LED device, including a sapphire substrate, n-type GaN layer on the substrate, p-type GaN layer, an active layer between the n-type GaN layer and the p-type GaN layer, and a ZnO layer to provide a current spreading layer and transparent contact for the LED device. For example, the active layer in these structures can include intrinsic GaN with lower-bandgap $In_xGa_{1-x}N$ quantum wells, e.g., for increased carrier localization and recombination efficiency. In some implementations, the device 100 can be used to fabricate the example ZnO based LED device 200 on a substrate having a greater size than those in the conventional LED devices, e.g., such as substrates having a diameter of or greater than 4 inches. In some implementations, the ZnO based LED device 200 is formed on a chip having a chip size greater than 950×500 μm.

In implementations, the device 100 can be operated to perform a method for fabricating an LED device including a ZnO structure. The method includes holding a substrate (e.g., wafer) within the chamber 106 (e.g., using the holder 111) so that a surface of the substrate wafer is along a vertical direction aligned with a gravitational field (gravity), in which the substrate wafer was previously processed to include light-emitting semiconductor layers (e.g., GaN stack) operable to emit light under electrical excitation. The method includes spinning the substrate (e.g., using the holder 111) to spin about a horizontal axis. The method includes, while maintaining the substrate to spin about the horizontal axis, performing a thermal hydro synthesis process in the chamber 106 to grow a single crystal ZnO structure over the light-emitting semiconductor layers to achieve a high quality in the grown single crystal ZnO structure.

In some implementations of the method, for example, the growing of the single crystal ZnO structure formed over the second semiconductor layer includes performing a first thermal hydro synthesis process to grow a bottom single crystal ZnO portion over a top of the light-emitting semiconductor layers; and subsequently performing a second thermal hydro synthesis process to grow a top single crystal ZnO portion extending from the bottom single crystal ZnO portion. In some implementations, for example, the method includes controlling the first thermal hydro synthesis process to ensure that the bottom single crystal ZnO portion is a contiguous structure over the top of the light-emitting semiconductor layers without having voids that expose the top of the light-emitting semiconductor layers. In some implementations, for example, the method includes controlling the second thermal hydro synthesis process to introduce voids into the top single crystal ZnO portion.

Figure 24:
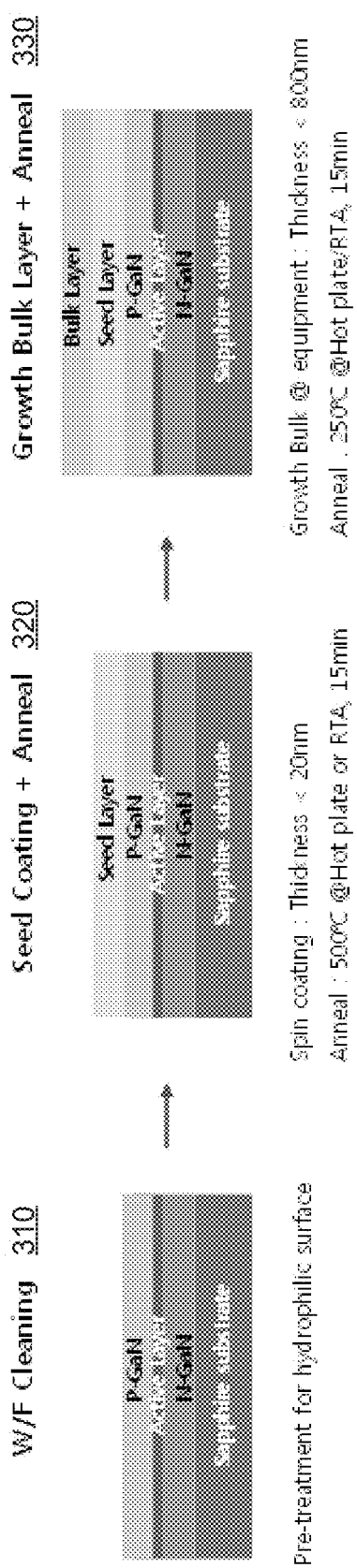
FIG. 24 illustrates an example method of growing a single crystal ZnO structure over a GaN stack using the example device shown in FIG. 1.

FIG. 24 illustrates the method of growing the single crystal ZnO structure over a GaN stack. The method includes a process 310 to clean the substrate (e.g., GaN stack on the sapphire), e.g., which can include pretreating the substrate for a hydrophilic surface. The method includes a process 320 to seed coat ZnO on the GaN layer and anneal the ZnO seeds. For example, the ZnO seeds can be formed by spin coating ZnO (e.g., thickness of 20 nm or less), and annealing the ZnO seeded substrate at 500° C., e.g., on a hotplate or RTA, for 15 min. The method includes a process 330 to form a bulk layer of the ZnO to grow a single crystal ZnO structure over the GaN stack, e.g. using a thermal hydro synthesis process in the chamber 106 of the device 100, such that the ZnO seeded substrate is spun by the holder 111 while immersed in the ZnO solution in the chamber 106. The process 330 includes subsequently annealing the ZnO bulk-layer-formed substrate, e.g., at 250° C., e.g., on a hotplate or RTA, for 15 min. For example, the grown ZnO layer can be formed to have a thickness of 800 nm or less.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

FIG. 25 shows images of an example embodiment of the holder 111 to secure and rotate the substrate during a layer fabrication process of the present technology. For example, the holder 111 can include multiple receiving surfaces 111A to allow multiple substrates to undergo the fabrication process, and provide the substrate's surface (e.g., GaN stack on sapphire or other substrate) upon which a layer (e.g., ZnO) is to be grown to be exposed in all direction of the substrate (e.g., wafer), e.g., such as implementing a THS method. It is noted, for example, that in the exemplary THS implementations described in FIG. 24, ZnO growth only occurs on the side of the formed seed layer. The images of FIG. 25 show an example implementation of loading a wafer in one of the receiving surfaces of the holder 111, e.g., as shown in images 401, 402, and 403. In the example embodiment, the holder 111 includes a Teflon frame including a plurality of discs presenting the receiving surface 111A (e.g., structured as an "X" with a central hole through the X), in which the multiple discs can be connected via securement screws or bolts. The example loading implementation includes image 404 showing securement of the holder 111 having a wafer loaded therein within the interior chamber 106, e.g., coupled to the rotating shaft 113.

Examples of Current Blocking Layer for ZnO Devices

This patent document provides various implementations of a ZnO based LED device with a current blocking layer (CBL) with improved characteristics. The CBL has been used in a ITO based LED device to improve light extract efficiency since the CBL can effectively operate to improve light characteristics emitted from, for example, multiple quantum well (MQW) of a light emitting portion of the LED device. As the ZnO based LED device has been attracted considerable attention for various applications, various implementations of the disclosed technology propose the configuration of the CBL that helps the ZnO layer to have better current spreading effects and relieve current crowding.

Figure 26:
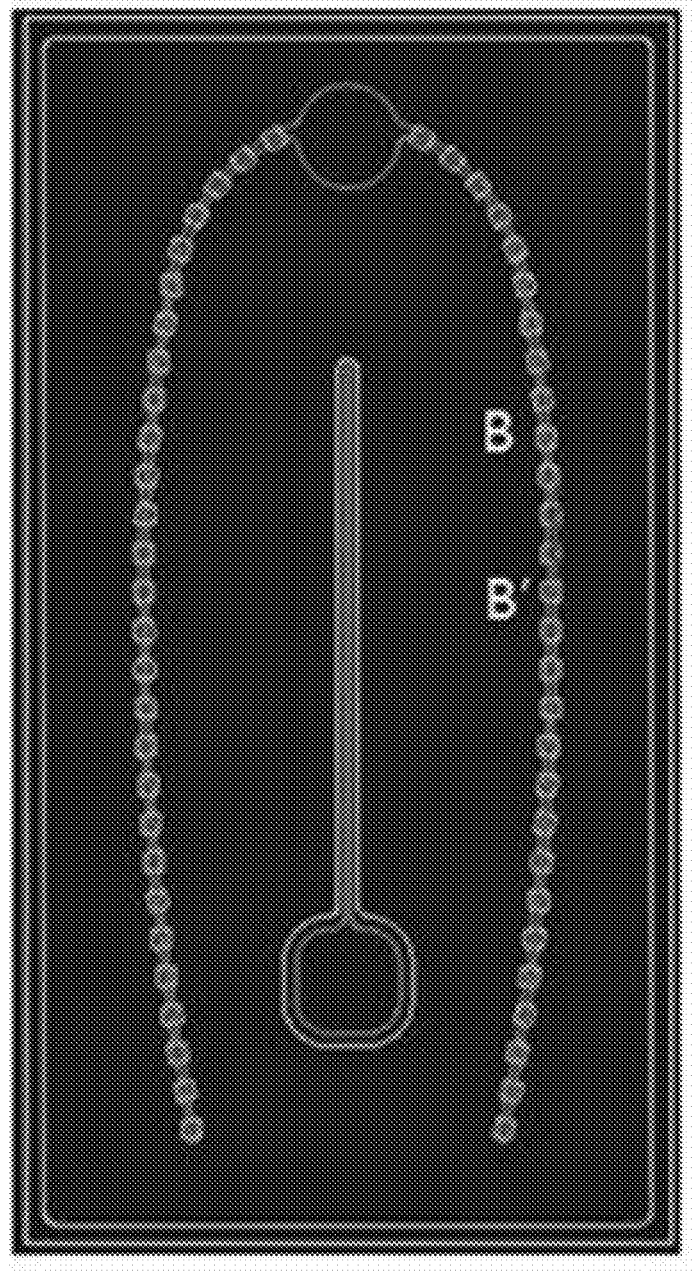
FIG. 26 shows a plan view of an exemplary ZnO based LED device with a current blocking layer (CBL).
Figure 27:
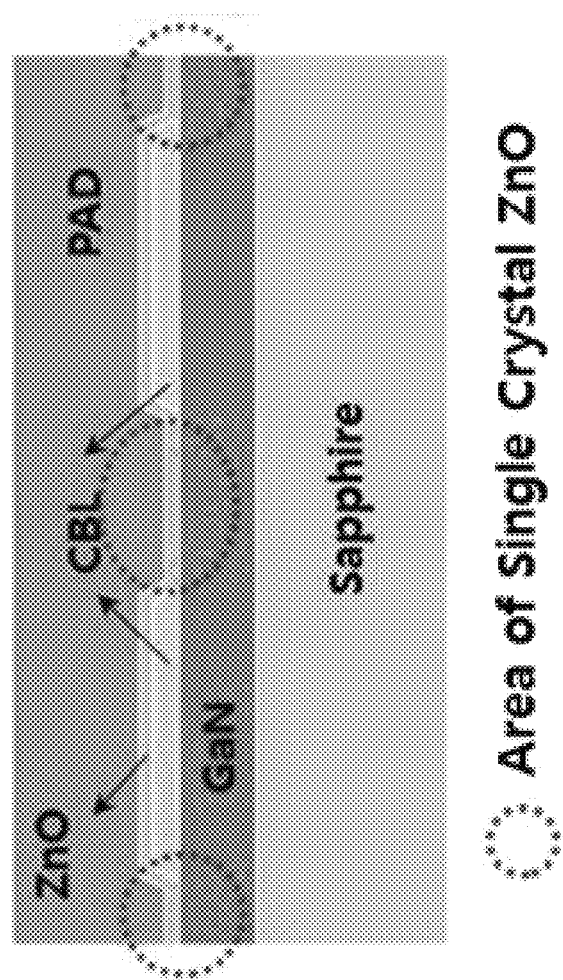
FIG. 27 shows a cross-sectional view taken along line B-B' of FIG. 27.

FIG. 26 illustrates a plan view of an exemplary ZnO based LED device and FIG. 27 is a cross-sectional view taken along line A-A' of FIG. 26.

Referring to FIGS. 26 and 27, the light emitting diode device includes a substrate, a semiconductor layer, a current block layer (CBL), a ZnO layer, and an electrode pad. The substrate includes a growth substrate, for example, a sapphire substrate, a silicon carbide substrate, a silicon substrate, a gallium nitride substrate, and the like, for growth of gallium nitride-based epitaxial layers. The semiconductor layer is formed on the substrate. The semiconductor layer can include an LED epi-structure with multiple layers. In some implementations, the semiconductor layer includes a p-type GaN layer, a n-type GaN layer, and an active layer interposed between the p-type GaN layer and the n-type GaN layer.

In some implementations, the semiconductor layer includes III-nitrides. The III-nitrides may be referred to as group III-nitrides, nitrides, or by (Al,Ga,In)N, AlInGaN, or Al(1-x-y)InyGaxN where 0<x<1 and 0<y<1, for example. These terms can be broadly construed to include respective nitrides of the single species, Al, Ga, and In, as well as binary, ternary and quaternary compositions of such Group III metal species. Accordingly, the semiconductor layer can include the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed. Accordingly, a primary reference to GaN materials is applicable to the formation of various other (Al, Ga, In)N material species. Further, (Al,Ga,In)N materials may further include minor quantities of dopants and/or other impurity or inclusional materials. Boron may also be included in the III-nitride alloy.

The CBL is formed on the semiconductor layer and the ZnO layer is formed on the CBL. In some implementations, the CBL may be arranged in a pattern. That is, the CBL is formed on only some portions of the semiconductor layer while leaving other portions of the semiconductor layer without the CBL thereon. In this case, some portions of the ZnO layer are formed on the CBL and other portions of the ZnO layer are formed on the semiconductor layer. With the structure, the CBL can permit current spreading of the ZnO layer and relieve current crowding as discussed later in this patent document.

The ZnO layer can include any material where the component species Zn and O make up the majority of the compound, and the material retains the hexagonal Wurtzite crystal structure of ZnO. This is inclusive of aluminum doped zinc oxide (AZO), gallium doped zinc oxide (GZO), and indium doped zinc oxide (MO). This also includes materials with minor quantities of other dopants and/or other impurity or inclusional materials, as well as materials that are off-stoichiometric due to the presence of vacancy and interstitial type material defects.

Figure 28:
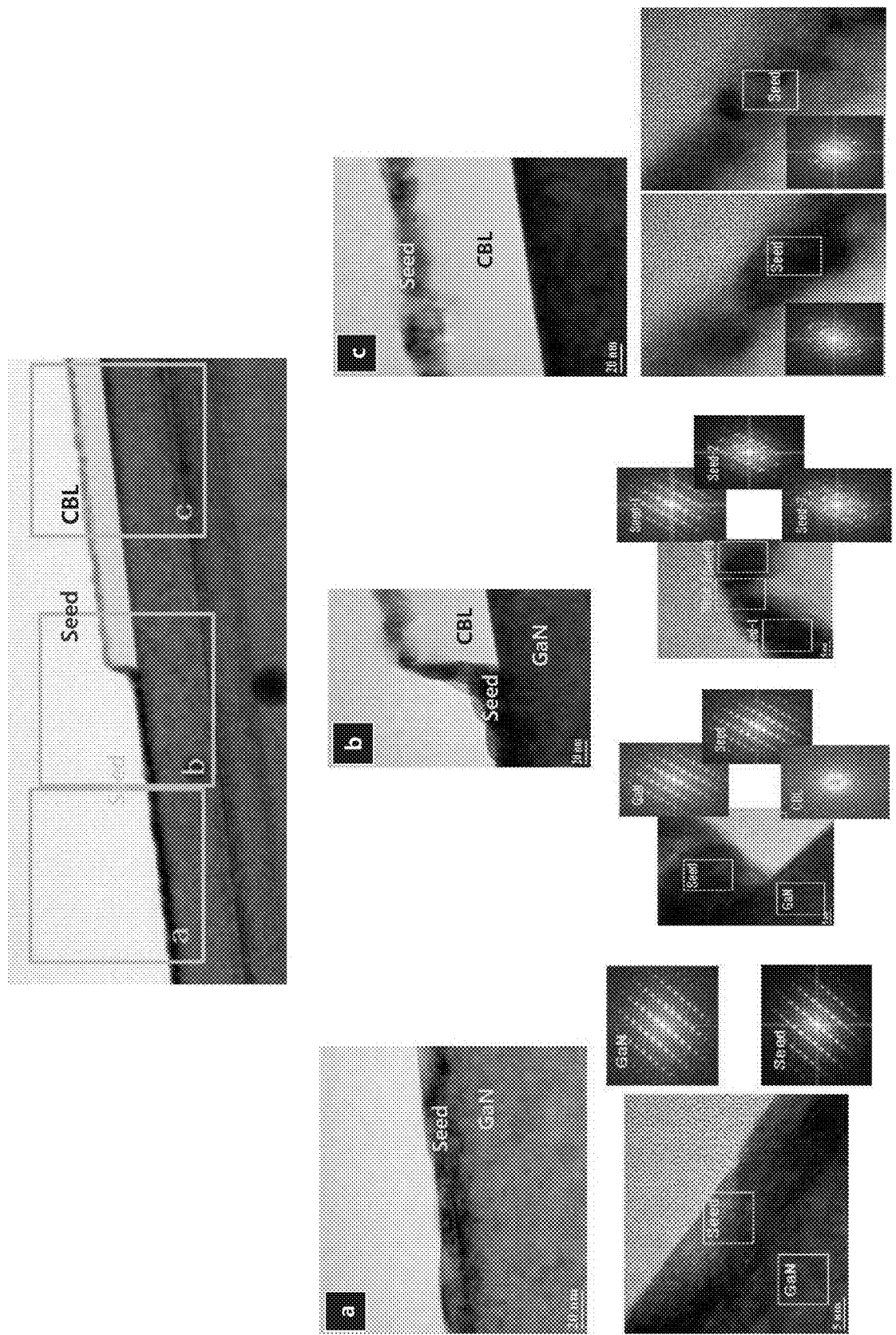
FIGS. 28 and 29 show various images of a ZnO layer formed over a CBL and having a poly-crystal structure.
Figure 29:
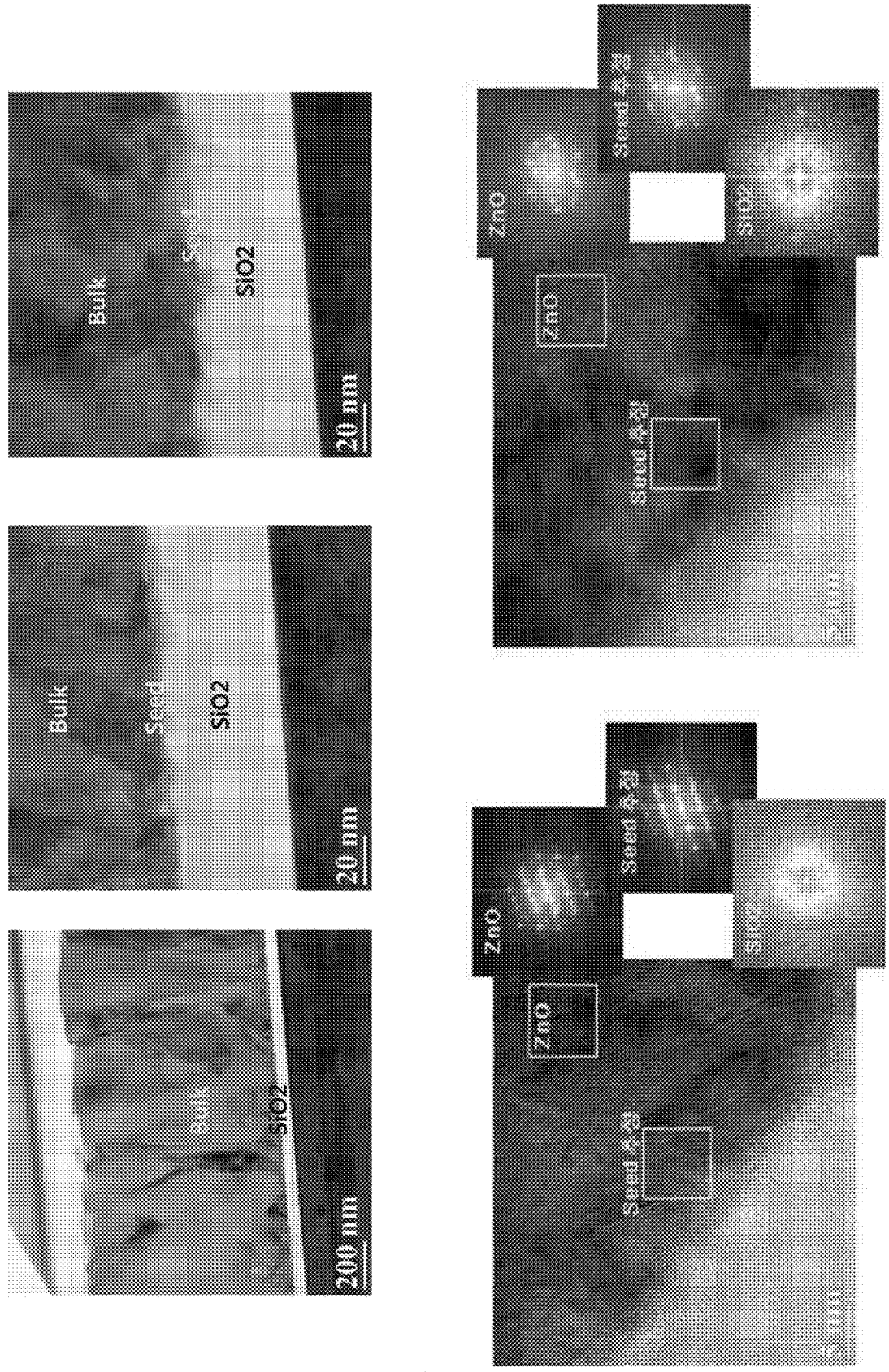
Figure 30:
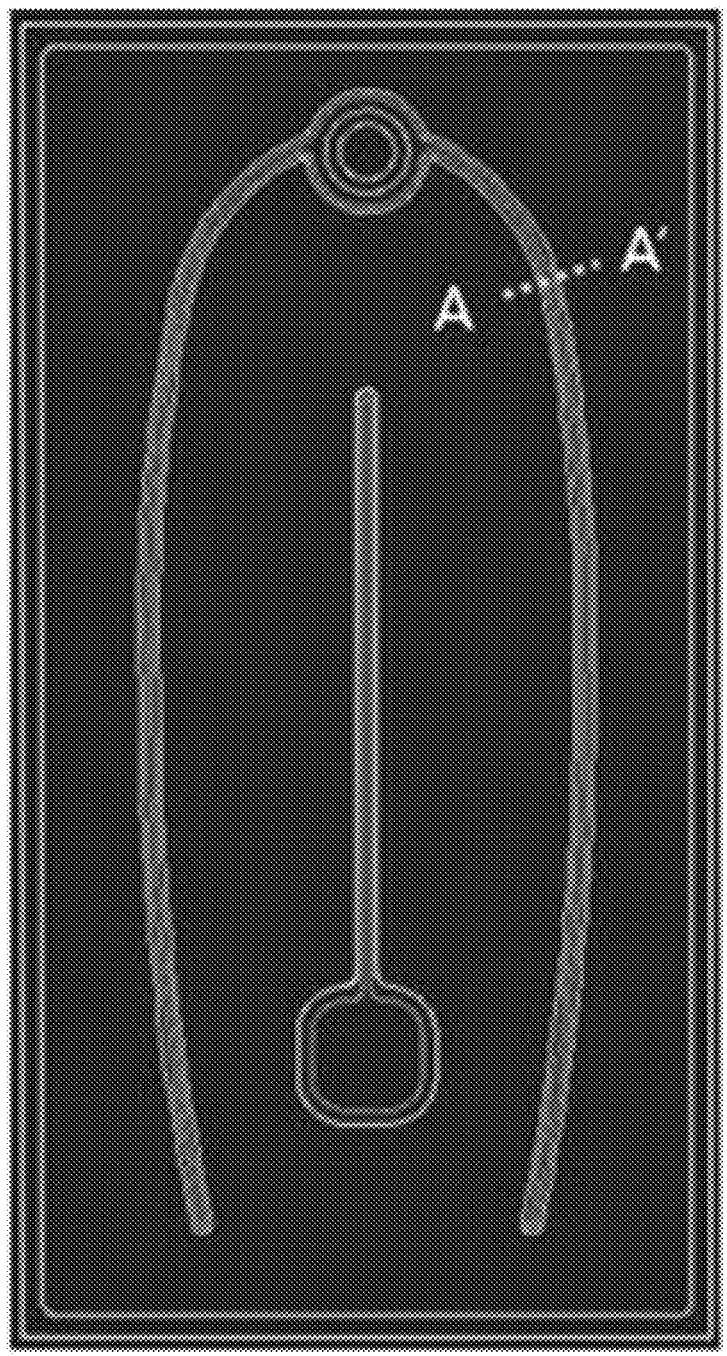
FIG. 30 shows an ZnO based LED device of a comparative example in a plan view.

Some implementations of the disclosed technology suggest a two-step growth technique to form the ZnO layer. In the first step, conditions are used to deposit a thin continuous or contiguous ZnO seed layer on the semiconductor layer, for example, a p-type GaN layer. The second step is performed to grow the ZnO bulk layer extended from the ZnO seed layer. The ZnO layer has different characteristics depending on whether the ZnO layer is formed on the semiconductor layer or the CBL. When the ZnO layer is formed on the semiconductor layer without the CBL, the ZnO layer forms a single-crystal structure with the semiconductor layer. When the ZnO layer is formed on the CBL, the ZnO layer forms a poly-crystal structure with the CBL. This is because while the material of the semiconductor layer is selected to have a lattice coefficient very similar to that of the ZnO layer, the material of the CBL (for example, $SiO_2$) has a different lattice coefficient from the ZnO layer. FIGS. 29 and 30 show various images of the ZnO layer formed over the CBL and having the poly-crystal structure. In FIGS. 28 and 29, the GaN layer is provided as the semiconductor layer and the SiO2 layer is provided as the CBL.

While the ZnO layer is configured to include portions having different crystal structures based on whether the corresponding portions are formed over the CBL or the semiconductor layer, the CBL needs to be configured to operate properly with the ZnO layer. Referring back to FIGS. 26 and 27, in the exemplary ZnO based LED device, the CBL is formed in the pattern and the electrode pad directly contacts with portions of the ZnO layer having single-crystal structure (see the red circles indicated in FIG. 27). In this implementation, the portions of the ZnO layer having the single-crystal structure as well as the portions of the ZnO layer having the poly-crystal structure contact with the electrode pad.

In some implementations, the CBL layer may be formed in the ZnO based LED device shown in FIG. 1. The CBL layer will be formed between the ZnO layer and the GaN layer. In some implementations, the CBL layer will be formed between the p-type GaN layer and the ZnO seed layer.

Figure 31:
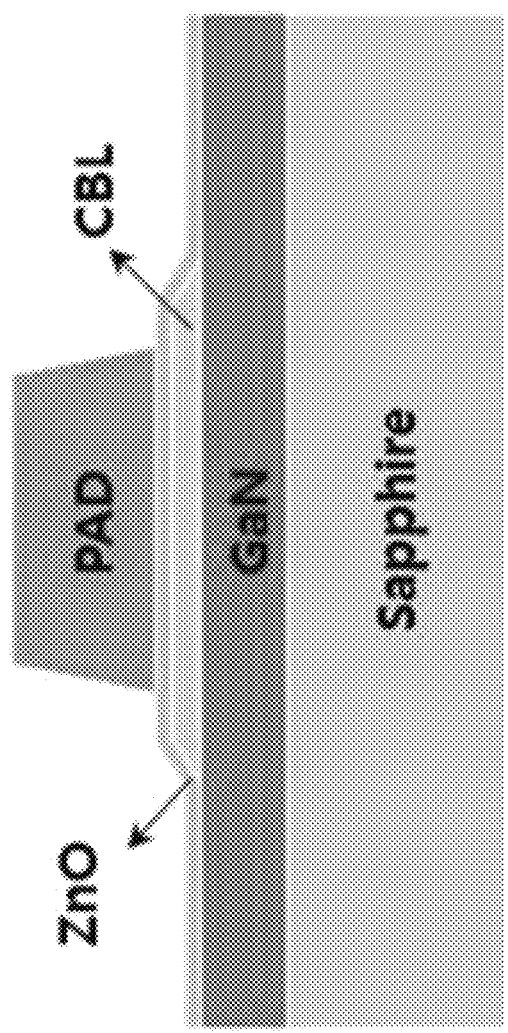
FIG. 31 shows a cross-sectional view taken along line A-A' of FIG. 31.
Figure 32:
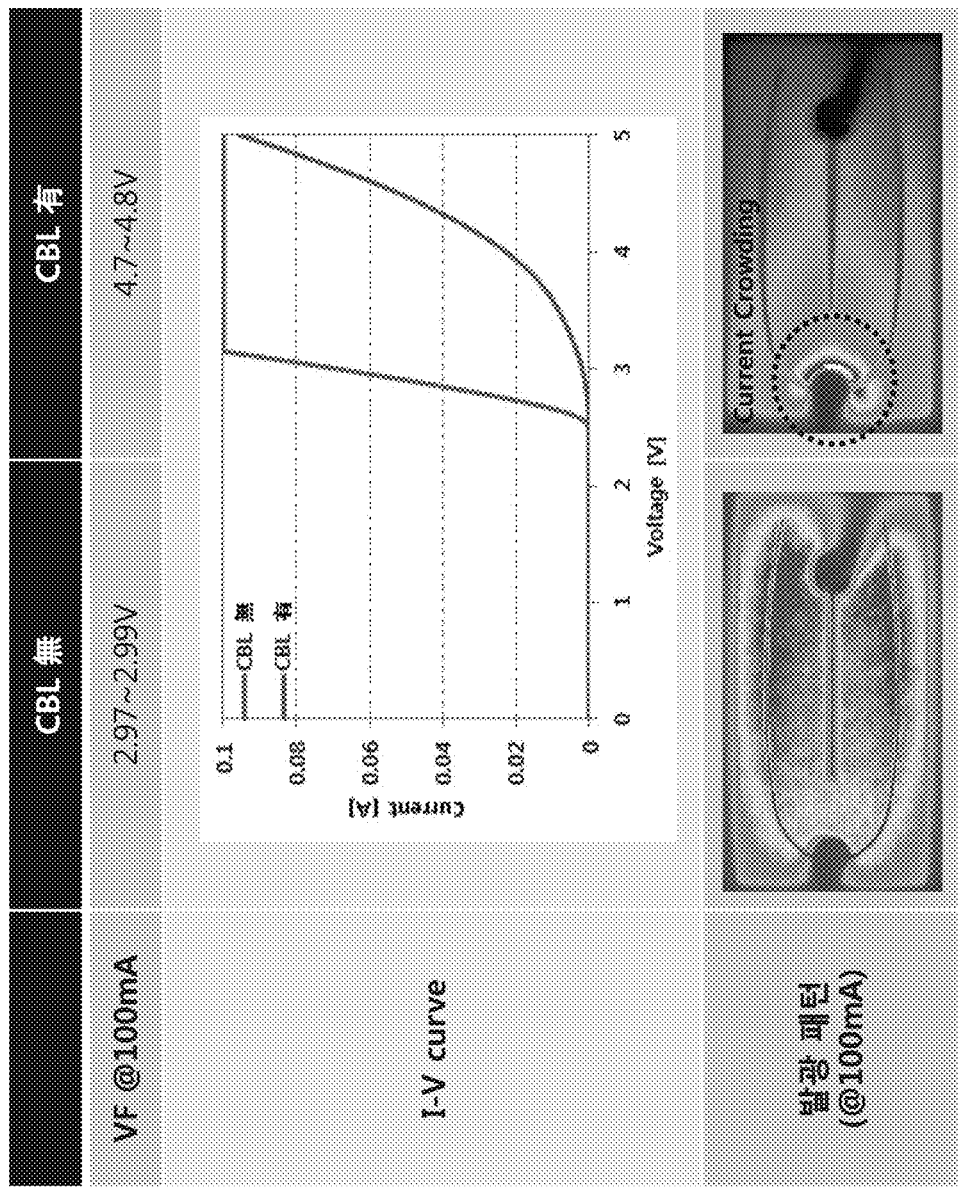
FIG. 32 shows performance data of a light emitting diode of a comparative example where a conventional CBL is applied to a ZnO based light emitting diode.

FIGS. 30 and 31 illustrate a light emitting diode of a comparative example in a plan view and a cross-sectional view. Unlike FIG. 27, the comparative example shows the configuration where the electrode pad does not contact with the ZnO layer having the single-crystal structure. In FIG. 31, the pad electrode contacts with the portions of the ZnO layer having the poly-crystal structure (i.e., the ZnO layer formed over the CBL) and does not contact with portions of the ZnO layer having the single-crystal structure (i.e., the ZnO layer formed over the semiconductor layer without the CBL). FIG. 32 shows performance data of the light emitting diode of the comparative example of FIGS. 30 and 31. As shown in FIG. 32, in the comparative example, the current cannot spread enough and the current crowding occurs in areas where no CBL is formed. FIG. 32 also shows that the comparative example provides high forward voltage and great contact resistance, which suggests that the CBL does not properly operate in the LED device.

Figure 33:
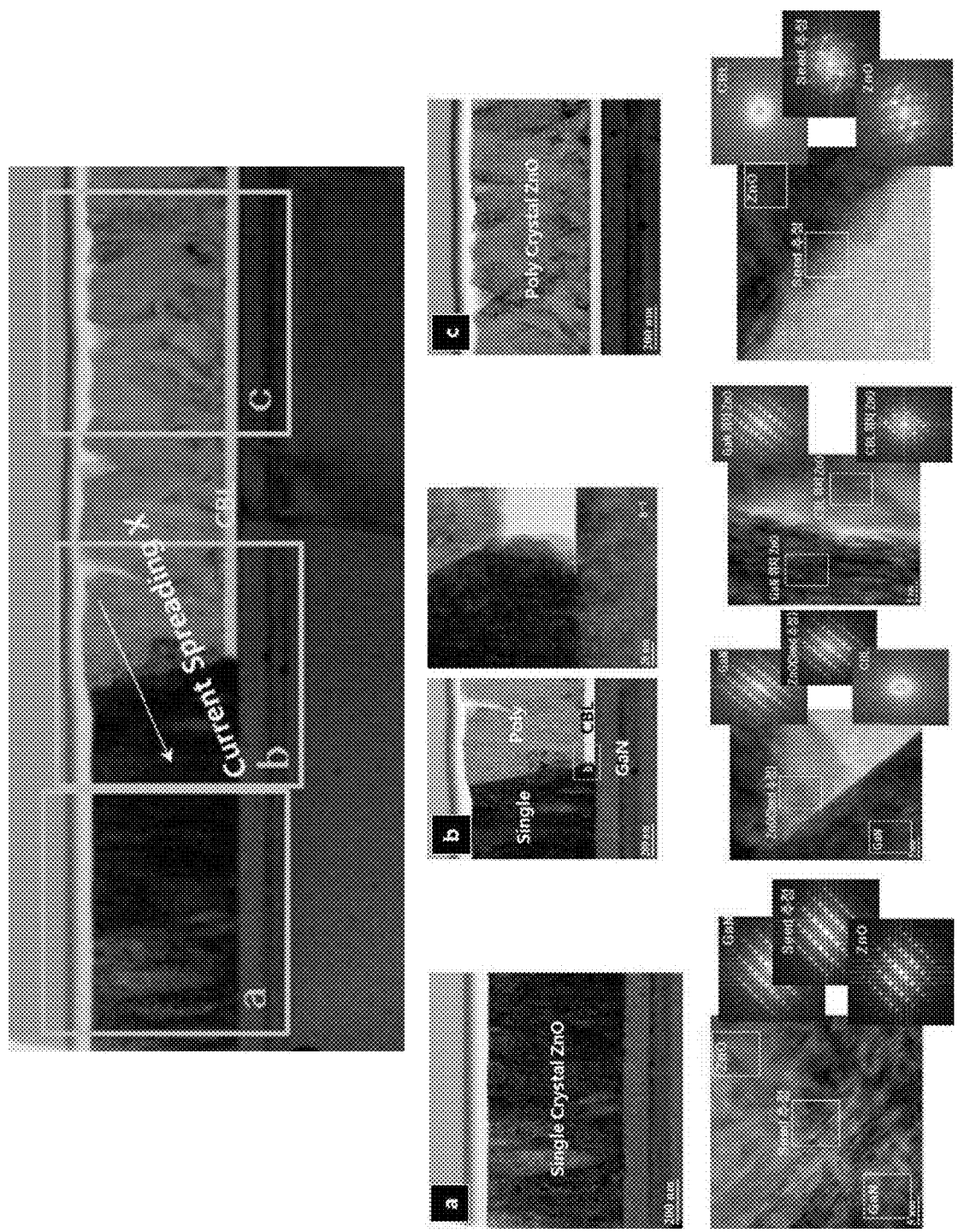
FIG. 33 illustrates detailed views of a ZnO layer of the comparative example as provided in FIGS. 30 and 31.
Figure 34:
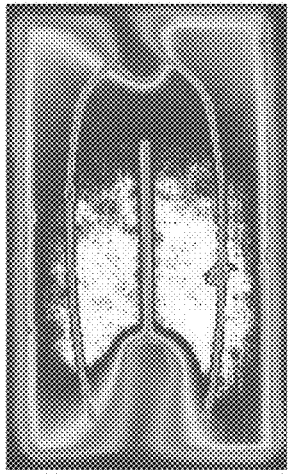
FIG. 34 shows performance data of an ITO-based LED device, an ZnO-based LED device without a CBL, and an ZnO-based LED device proposed in this patent document.

FIG. 33 illustrates detailed views of the ZnO layer of the ZnO based LED device as provided in the comparative example. In FIG. 33, the boxes (a), (b), (c) are marked to indicate respective portions. Box (a) indicates the portion of the ZnO layer having the single-crystal structure, box (c) indicates the portion of the ZnO layer having the poly-crystal structure, and box (b) indicates the boundary between the two portions of the ZnO layer having different crystal structures. In some implementations, the boundary between the two portions of the ZnO layer can be inclined. In the box (b), since the boundary between the single-crystal structured portion of the ZnO layer and the poly-crystal structured ZnO layer is formed, the current cannot spread. However, the proposed configuration as shown in FIGS. 26 and 27 solves the problem in the comparative example and provides the CBL having improved current spreading effects and preventing current crowding in the ZnO based LED device. As discussed, since the electrode pad directly contacts with the portion of the ZnO layer having the single-crystal structure, the current can spread in the single-crystal structured portion of the ZnO layer as well as the poly-crystal structured portion of the ZnO layer. FIG. 34 shows performance data of an ITO-based LED device, an ZnO-based LED device without a CBL, and an ZnO-based LED device with the CBL as shown in FIGS. 26 and 27. As shown in FIG. 34, the ZnO-based LED device with the CBL as shown in FIGS. 26 and 27 can provide power output and forward voltage at the similar levels obtained in the ITO-based LED device and the ZnO-based LED without the CBL.

Figure 35:
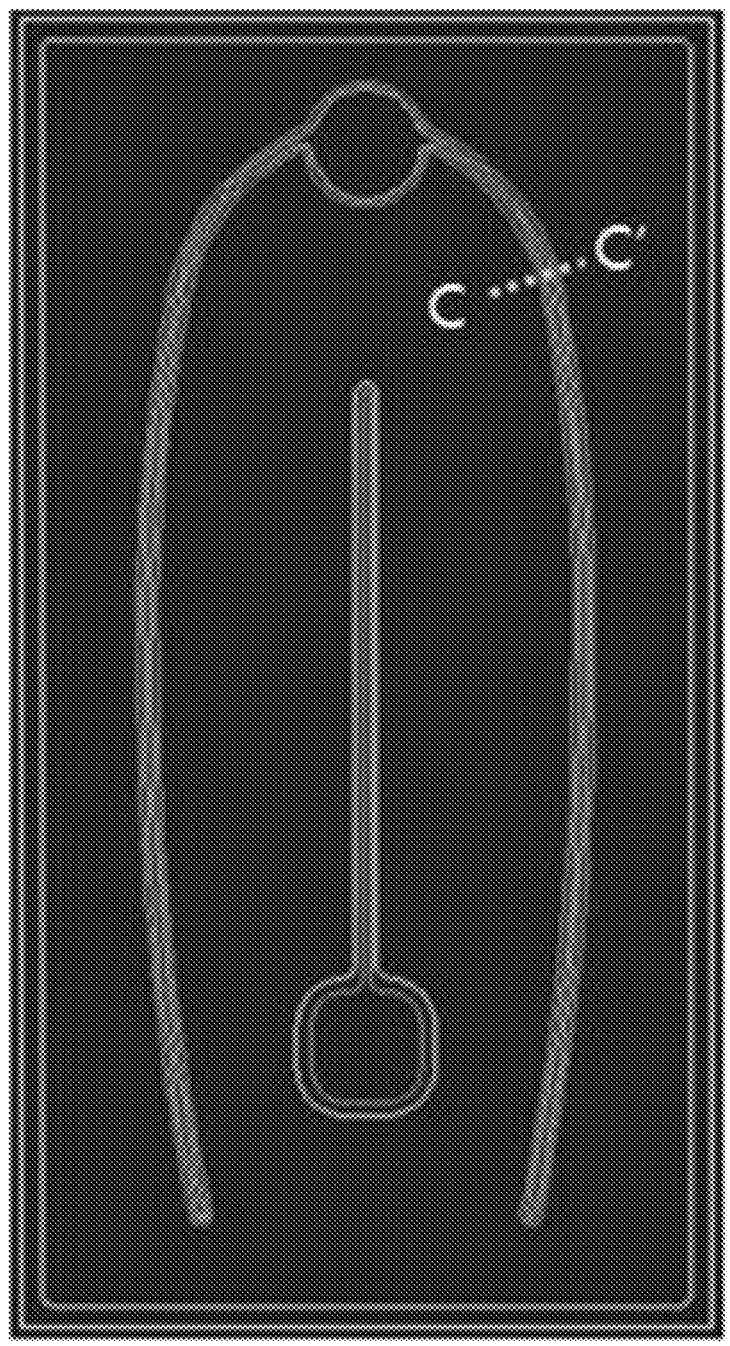
FIG. 35 illustrates a plan view of another exemplary ZnO LED device with a CBL.
Figure 36:
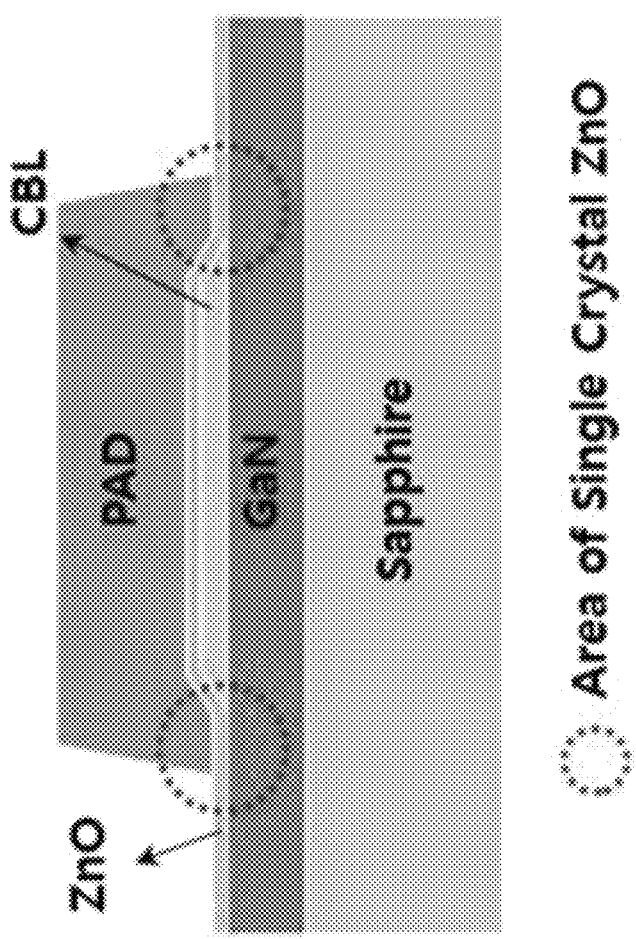
FIG. 36 illustrates a cross-sectional view taken along line C-C' of FIG. 36.

FIGS. 35 and 36 illustrate another exemplary ZnO based LED device with a CBL. FIG. 35 is a plan view of the proposed ZnO based LED device and FIG. 36 is a cross-sectional view taken along line A-A' of FIG. 35. As compared to FIGS. 26 and 27 above where the CBL is formed under only some portions of the electrode pad, in FIGS. 35 and 36, the electrode pad is formed to have a great size sufficiently allowing the electrode pad to contact with the portions of the ZnO layer having the single-crystal structure (see the red circles indicated in FIG. 36). Due to the contact of the electrode pad with the singe-crystal structured portion of the ZnO layer, the current can spread in the single-crystal structured portion as well as in the poly-crystal structured portion. Thus, the ZnO-based LED device can exhibit improved characteristics.

Various implementations of the light emitting diode devices with zinc oxide layer are discussed in this patent document. In one aspect, a light emitting diode (LED) device is provided to include: a substrate; a first semiconductor layer exhibiting a first conductivity type and formed over the substrate; an active light-emitting structure formed over the first semiconductor layer, the active light-emitting structure operable to emit light under electrical excitation; a second semiconductor layer exhibiting a second conductivity type and formed over the active light-emitting structure; a single crystal ZnO structure formed over the second semiconductor layer and including a bottom single crystal ZnO portion over the second semiconductor layer and a top single crystal ZnO portion extending from the bottom single crystal ZnO portion, wherein the bottom single crystal ZnO portion is a contiguous single crystal ZnO portion without having voids.

In some implementations, the top single crystal ZnO portion and the bottom single crystal ZnO portion form a contiguous single crystal ZnO. In some implementations, the top single crystal ZnO portion and the bottom single crystal ZnO portion are formed by two different thermal hydro synthesis processes, and the bottom single crystal ZnO portion is formed by a first thermal hydro synthesis process and the top single crystal ZnO portion is formed by a second thermal hydro synthesis process subsequent to the first thermal hydro synthesis process. In some implementations, the top single crystal ZnO portion includes voids to improve a performance of the LED device. In some implementations, the voids are relatively uniformly distributed in the top single crystal ZnO portion. In some implementations, the top single crystal ZnO portion and the voids therein are structured to provide air gaps that affect light extraction efficiency of the LED device. In some implementations, the top single crystal ZnO portion and the voids therein are structured to have a positional distribution that enhances an optical or electrical property of the LED device. In some implementations, the bottom single crystal ZnO portion has a thickness of a few hundred angstroms. In some implementations, the bottom single crystal ZnO portion has a thickness equal to or less than 200 angstroms. In some implementations, the top single crystal ZnO portion has a thickness less than 1 μm. In some implementations, the top single crystal ZnO portion has a thickness equal to or less than 8000 angstroms. In some implementations, the single crystal ZnO structure has an inverse masa structure. In some implementations, the first and second semiconductor layers include GaN.

In another example aspect, a light emitting diode (LED) device is disclosed and includes: a substrate; a first semiconductor layer exhibiting a first conductivity type and formed over the substrate; an active light-emitting structure formed over the first semiconductor layer, the active light-emitting structure operable to emit light under electrical excitation; a second semiconductor layer exhibiting a second conductivity type and formed over the active light-emitting structure; a single crystal ZnO structure formed over the second semiconductor layer and including a bottom single crystal ZnO portion over the second semiconductor layer and a top single crystal ZnO portion extending from the bottom single crystal ZnO portion, wherein the top single crystal ZnO portion is structured to include voids to improve a performance of the LED device.

In some implementations, the top single crystal ZnO portion is structured to include the voids to improve a light extraction performance of the LED device. In some implementations, the top single crystal ZnO portion is structured to include the voids to improve an electrical performance of the LED device. In some implementations, the top single crystal ZnO portion and the bottom single crystal ZnO portion form a contiguous single crystal ZnO. In some implementations, the top single crystal ZnO portion and the bottom single crystal ZnO portion are formed by two different thermal hydro synthesis processes, and the bottom single crystal ZnO portion is formed by a first thermal hydro synthesis process and the top single crystal ZnO portion is formed by a second thermal hydro synthesis process subsequent to the first thermal hydro synthesis process. In some implementations, the bottom single crystal ZnO portion is a contiguous single crystal ZnO portion without having voids that exposes portions of the second semiconductor layer underneath the bottom single crystal ZnO portion.

In another example aspect, a light emitting diode (LED) device is disclosed and includes: a substrate; a first conductivity typed semiconductor layer formed over the substrate; an active layer formed over the first typed semiconductor layer; a second conductivity typed semiconductor layer formed over the active layer; a ZnO seed layer formed over the second conductivity typed semiconductor layer, the ZnO seed layer and the ZnO bulk layer form a single crystal structure; and a ZnO bulk layer formed over the ZnO seed layer.

In some implementations, the ZnO seed layer has a relatively continuous surface. In some implementations, the ZnO seed layer and the ZnO bulk layer exhibit no boundary between the ZnO seed layer and the ZnO bulk layer. In some implementations, the ZnO seed layer has a thickness on the order of a few hundreds angstrom. In some implementations, the ZnO seed layer has a thickness equal to or less than 200 angstrom. In some implementations, the ZnO seed layer includes an un-doped layer. In some implementations, the ZnO bulk layer includes a doped layer having the first type conductivity. In some implementations, the first conductivity typed semiconductor layer and the second conductivity typed semiconductor layer include GaN. In some implementations, the first conductivity typed semiconductor layer has a n type conductivity and the second conductivity typed semiconductor layer has a p type conductivity. In some implementations, the second conductivity typed semiconductor layer forms an Ohmic contact with the ZnO bulk layer. In some implementations, the ZnO bulk layer has a thickness less than 1 μm. In some implementations, the ZnO bulk layer has a thickness equal to or less than 8000 angstrom. In some implementations, the ZnO bulk layer includes voids formed inside the ZnO bulk layer. In some implementations, the voids provide air gaps that affect refractive index of the ZnO bulk layer and operate to enhance optical properties of the LED device. In some implementations, the voids are controlled to have a positional distribution that allows to enhance optical properties of the LED device. In some implementations, the voids are controlled to have a sufficient amount to enhance optical properties of the LED device. In some implementations, the second conductivity typed semiconductor layer and the ZnO bulk layer forms an Ohmic contact. In some implementations, the ZnO bulk layer has an inverse masa structure. In some implementations, the ZnO bulk layer has a thickness greater than 50 times that of the ZnO seed layer. In some implementations, the ZnO seed layer is free of citrate.

In another example aspect, a light emitting diode (LED) device is disclosed and includes a substrate; a first conductivity typed semiconductor layer formed over the substrate; an active layer formed over the first type conductivity; a second conductivity typed semiconductor layer formed over the active layer; a ZnO seed layer formed over the second conductivity typed semiconductor layer; and a ZnO bulk layer formed over the ZnO seed layer and including voids in the ZnO bulk layer.

In some implementations, the ZnO bulk layer is porous. In some implementations, the voids are relatively uniformly distributed. In some implementations, the voids provide air gaps that affect extraction efficiency and operate to enhance optical properties of the LED device. In some implementations, the voids are controlled to have a positional distribution that allows to enhance optical properties of the LED device. In some implementations, the voids are controlled to have a sufficient amount to enhance optical properties of the LED device. In some implementations, the LED device exhibits improved light extraction efficiency compared to the ZnO bulk layer without voids. In some implementations, the ZnO bulk layer includes a doped layer having the first type conductivity. In some implementations, the first conductivity typed semiconductor layer has a n type conductivity and the second conductivity typed semiconductor layer has a p type conductivity. In some implementations, the ZnO seed layer has a relatively continuous surface. In some implementations, the ZnO seed layer and the ZnO bulk layer form a single crystal structure. In some implementations, the ZnO seed layer and the ZnO bulk layer exhibit no boundary between the ZnO seed layer and the ZnO bulk layer. In some implementations, the ZnO seed layer has a thickness on the order of a few hundreds angstrom. In some implementations, the ZnO seed layer has a thickness equal to or less than 200 angstrom. In some implementations, the ZnO bulk layer has a thickness less than 1 μm. In some implementations, the ZnO bulk layer has a thickness equal to or less than 8000 angstrom. In some implementations, the ZnO bulk layer has an inverse masa structure In another example aspect, a method of fabricating a light emitting diode (LED) device including a ZnO structure is disclosed. The method includes: providing a substrate; forming light-emitting semiconductor layers over the substrate, the light-emitting semiconductor layers operable to emit light under electrical excitation; and growing a single crystal ZnO structure over the light-emitting semiconductor layers, wherein the growing of the single crystal ZnO structure includes: forming a bottom single crystal ZnO portion over a top of the light-emitting semiconductor layers using a first aqueous solution, wherein the top of the light-emitting semiconductor layers is hydrophilicity treated; and forming a top single crystal ZnO portion using a second aqueous solution to extend from the bottom single crystal ZnO portion.

In some implementations, the forming of the bottom single crystal ZnO portion includes performing a spin coating while maintaining a relatively regular growing speed of the bottom single crystal ZnO portion. In some implementations, the method further comprises controlling the forming of the bottom single crystal ZnO portion to ensure that the bottom single crystal ZnO portion is a contiguous structure over the top of the light-emitting semiconductor layers without having voids that expose the top of the light-emitting semiconductor layers. In some implementations, the forming of the top single crystal ZnO portion includes rotating the substrate along a vertical direction within a chamber, the substrate is previously processed to include the light-emitting semiconductor layers. In some implementations, the forming of the top single crystal ZnO portion includes controlling a growing speed of the top single crystal ZnO portion to provide a desired thickness of the top single crystal ZnO portion. In some implementations, the method further comprises: controlling the forming of the top single crystal ZnO portion to introduce voids into the top single crystal ZnO portion. In some implementations, the controlling of the forming of the top single crystal ZnO portion includes varying an amount or a positional distribution of the voids to enhance a performance of the LED device. In some implementations, the forming of the bottom single crystal ZnO portion includes controlling PH level to supersaturate the first aqueous solution. In some implementations, the forming of the bottom single crystal ZnO portion includes forming the bottom single crystal ZnO portion to occupy at least 90% of a total surface of a top of the light-emitting semiconductor layers. In some implementations, the method further comprises, after forming of the top single crystal ZnO portion: forming a photoresist (PR) layer over the top single crystal ZnO portion; and removing the PR layer using a PR remover free of an alkarine element. In some implementations, the PR remover includes propylene glycol monomethyl ether, alcohols, C12-14, ethoxylated, or 1-metil-2-pirrolidona. In some implementations, the PR remover includes at least one of propylene glycol monomethyl ether or N-metil-2-pirrolidona. In some implementations, the method further comprises: performing an annealing process on the bottom single crystal ZnO portion at a first temperature; and performing an annealing process on the top single crystal ZnO portion at a second temperature, wherein the second temperature is lower than the first temperature. In some implementations, the method further comprises: etching the single crystal ZnO structure, the etched single crystal ZnO structure having a sidewall with an inverse mesa shape. In some implementations, the substrate has a diameter equal to or greater than 4 inch. In some implementations, the growing of the single crystal ZnO structure includes controlling a growing speed of the single crystal ZnO structure to have a desired thickness.

In another example aspect, thermal hydro-synthesis (THS) devices, systems, and methods are disclosed for forming layers of semiconductor materials to produce optoelectronic devices. In some aspects, a device for producing a ZnO layer on GaN layer (e.g., p-type GaN layer) is disclosed.

In some aspects, a device for fabricating a semiconductor material device includes a housing structured to include an interior chamber to contain a fluid, the housing including a first access opening to the interior chamber to allow a liquid solution to enter, a second access opening to the interior chamber to allow the liquid solution to exit, and a third access opening to the interior chamber to allow a gas to exit or enter; a heating unit to apply heat into the interior chamber; a holder disposed within the interior chamber and structured to include a receiving surface to receive a sample or substrate upon which to fabricate semiconductor device layers, where the holder is oriented in the interior chamber such that the receiving surface is along a vertical direction; and a motor coupled to the holder and operable to drive rotational movement of the holder within the interior chamber to cause the holder to spin about its central axis, in which the device is operable to facilitate deposition and growth of a semiconductor layer on the substrate during spinning of the holder immersed in the solution under applied heat within the interior chamber to produce a semiconductor material device.

In some aspect, a method for fabricating a light emitting diode (LED) device including a ZnO structure includes holding a substrate wafer within a chamber so that a surface of the substrate wafer is along a vertical direction along a gravitational field, in which the substrate wafer is previously processed to include light-emitting semiconductor layers operable to emit light under electrical excitation; spinning the substrate wafer to spin about a horizontal axis; and while maintaining the substrate wafer to spin about the horizontal axis, performing a thermal hydro synthesis process to grow a single crystal ZnO structure over the light-emitting semiconductor layers to achieve a high quality in the grown single crystal ZnO structure.

In another example aspect, a light emitting diode (LED) device is provided to comprise: a substrate; a semiconductor layer formed over the substrate; a ZnO layer formed over the semiconductor layer and including a single-crystal ZnO portion and a poly-crystal ZnO portion; an electrode pad formed over the ZnO layer to be in direct contact with the single-crystal ZnO portion; and a current blocking layer (CBL) formed between the poly-crystal ZnO portion and the semiconductor layer.

In some implementations, the single-crystal ZnO portion is positioned directly above the semiconductor layer. In some implementations, the single-crystal ZnO portion and the poly-crystal ZnO portion form a boundary preventing current from spreading between the boundary. In some implementations, the ZnO layer includes a ZnO seed layer and a ZnO bulk layer formed on the ZnO seed layer. In some implementations, the semiconductor layer includes a material having a lattice coefficient similar to that of the ZnO layer. In some implementations, the CBL includes an insulation material including SiO2. In some implementations, the CBL includes a material having a lattice coefficient different from that of the ZnO layer.

In another example aspect, a light emitting diode (LED) device is disclosed and includes a substrate; a semiconductor layer formed over the substrate; a ZnO layer formed over the semiconductor layer; an electrode pad formed over the ZnO layer; a current blocking layer (CBL) formed between portions of the ZnO layer and the semiconductor layer, the portions of the ZnO layer spaced apart from one another and the CBL having a pattern, wherein the electrode pad directly contacts other portions of the ZnO layer that are positioned directly above the semiconductor layer.

In some implementations, the portions of the ZnO layer formed over the CBL have a poly-crystal structure and other portions of the ZnO layer formed directly over the semiconductor layer have a single-crystal structure. In some implementations, the single-crystal ZnO portion and the poly-crystal ZnO portion form a boundary preventing current from spreading between the boundary. In some implementations, the semiconductor layer includes a material having a lattice coefficient similar to that of the ZnO layer. In some implementations, the CBL includes an insulation material including SiO2. In some implementations, the CBL includes a material having a lattice coefficient different from that of the ZnO layer.

In another example aspect, a light emitting diode (LED) device is disclosed and includes a substrate; a semiconductor layer formed over the substrate; a current blocking layer (CBL) formed over the semiconductor layer; a ZnO layer formed over the CBL to cover the CBL including a top surface and sides of the CBL, the ZnO layer extended to cover the semiconductor layer; an electrode pad formed over the ZnO layer and having a size sufficiently covering the CBL such that the electrode pad directly contacts with the ZnO layer covering the semiconductor layer.

In some implementations, the ZnO layer covering the semiconductor layer has a single-crystal structure. In some implementations, the ZnO layer covering the top surface of the CBL has a poly-crystal structure. In some implementations, the ZnO layer covering the sides of the CBL includes a boundary between different crystal structures. In some implementations, the semiconductor layer includes a material having a lattice coefficient similar to that of the ZnO layer. In some implementations, the CBL includes an insulation material including SiO2. In some implementations, the CBL includes a material having a lattice coefficient different from that of the ZnO.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed are techniques and structures as described and shown, including:

1. A light emitting diode (LED) device, comprising:
a substrate;
a first semiconductor layer having a first conductivity type and formed over the substrate;
an active light-emitting structure formed over the first semiconductor layer, the active light-emitting structure operable to emit light under electrical excitation;
a second semiconductor layer having a second conductivity type and formed over the active light-emitting structure; and
a crystal ZnO structure formed over the second semiconductor layer and including a bottom single crystal ZnO portion over the second semiconductor layer and a top single crystal ZnO portion extending from the bottom single crystal ZnO portion, wherein the bottom single crystal ZnO portion is a contiguous single crystal ZnO portion without voids, and
wherein the top single crystal ZnO portion includes an upper portion without a void and a lower portion that is located between the bottom single crystal ZnO portion and the upper portion and includes one or more voids situated near the bottom surface of the top single crystal ZnO portion to improve a performance of the LED device.

2. The device of claim 1, wherein:
the top single crystal ZnO portion and the bottom single crystal ZnO portion form a contiguous crystal ZnO.

3. The device of claim 1, wherein:
the bottom single crystal ZnO portion has a thickness equal to or less than 200 angstroms.

4. The device of claim 1, wherein:
The bottom single crystal ZnO portion is free of citrate.

5. The device of claim 1, wherein:
the top single crystal ZnO portion has a thickness less than 1 μm.

6. The device of claim 1, wherein:
the top single crystal ZnO portion has a thickness equal to or less than 8000 angstroms.

7. The device of claim 1, wherein the first and second semiconductor layers include GaN.

8. The device of claim 1, further including:
a current blocking layer (CBL) formed between the single crystal ZnO structure and the second semiconductor layer.

9. A light emitting diode (LED) device comprising:
a substrate;
a first semiconductor layer having a first conductivity type and formed over the substrate;
an active layer formed over the first semiconductor layer;
a second semiconductor layer having a second conductivity type and formed over the active layer;
a ZnO seed layer formed over the second semiconductor layer; and
a ZnO bulk layer formed over the ZnO seed layer, the ZnO seed layer and the ZnO bulk layer form a single crystal structure, and
wherein the ZnO bulk layer includes an upper portion without a void and a lower portion that is located between the ZnO seed layer and the upper portion and includes one or more void situated near a bottom surface of the ZnO bulk layer.

10. The LED device of claim 9, wherein the voids provide air gaps that affect extraction efficiency and operate to enhance optical properties of the LED device.

11. The LED device of claim 9, wherein the ZnO seed layer and the ZnO bulk layer exhibit no boundary between the ZnO seed layer and the ZnO bulk layer.

12. The LED device of claim 9, wherein the first semiconductor layer and the second semiconductor layer include GaN.

13. The LED device of claim 9, further including:
a current blocking layer (CBL) formed between the ZnO seed layer and the second conductivity typed semiconductor layer.

14. A light emitting diode (LED) device comprising:
a substrate;
a semiconductor layer formed over the substrate;
a ZnO layer formed over the semiconductor layer and including a single-crystal ZnO portion and a poly-crystal ZnO portion;
an electrode pad formed over the ZnO layer and in direct contact with the single-crystal ZnO portion; and
a current blocking layer (CBL) formed between the poly-crystal ZnO portion and the semiconductor layer, the CBL arranged on first portions of the semiconductor layer, and
wherein the single-crystal ZnO portion is disposed on second portions of the semiconductor layer, the second portions of the semiconductor layer different from the first portions of the semiconductor layer.

15. The LED device of claim 14,
wherein the single-crystal ZnO portion directly contacts to the semiconductor layer, and
wherein the poly-crystal ZnO portion directly contacts to the CBL.

16. The LED device of claim 14,
wherein the single-crystal ZnO portion and the poly-crystal ZnO portion form a boundary preventing current from spreading between the boundary.

17. The LED device of claim 14,
wherein the ZnO layer includes a ZnO seed layer and a ZnO bulk layer formed on the ZnO seed layer.

* * * * *